(12) United States Patent
Johnson et al.

(10) Patent No.: US 11,886,411 B2
(45) Date of Patent: Jan. 30, 2024

(54) DATA STORAGE USING ROARING BINARY-TREE FORMAT

(71) Applicant: Molecula Corp., Austin, TX (US)

(72) Inventors: Benjamin Johnson, Littleton, CO (US); Todd Gruben, Austin, TX (US)

(73) Assignee: Molecula Corp., Austin, TX (US)

( * ) Notice: Subject to any disclaimer, the term of this patent is extended or adjusted under 35 U.S.C. 154(b) by 170 days.

(21) Appl. No.: 17/462,517

(22) Filed: Aug. 31, 2021

(65) Prior Publication Data

US 2022/0374404 A1 Nov. 24, 2022

Related U.S. Application Data

(60) Provisional application No. 63/192,426, filed on May 24, 2021.

(51) Int. Cl.
*G06F 16/20* (2019.01)
*G06F 16/22* (2019.01)
*H03M 7/30* (2006.01)

(52) U.S. Cl.
CPC ...... *G06F 16/2246* (2019.01); *G06F 16/2237* (2019.01); *H03M 7/30* (2013.01)

(58) Field of Classification Search
CPC ... G06F 16/2246; G06F 16/2237; H03M 7/30
See application file for complete search history.

(56) References Cited

U.S. PATENT DOCUMENTS

| | | | |
|---|---|---|---|
| 5,963,933 A | 10/1999 | Cheng et al. | |
| 6,564,204 B1 | 5/2003 | Amundsen et al. | |
| 6,826,563 B1 * | 11/2004 | Chong | G06F 16/2237 707/999.003 |
| 7,640,262 B1 * | 12/2009 | Beaverson | G06F 16/2246 711/111 |
| 9,542,401 B1 * | 1/2017 | Veeraswamy | G06F 16/128 |
| 9,785,674 B2 | 10/2017 | Lang et al. | |
| 2007/0027860 A1 | 2/2007 | Bestgen et al. | |
| 2008/0036630 A1 * | 2/2008 | Lee | H03M 7/3088 341/51 |
| 2008/0225327 A1 * | 9/2008 | Smith | H04N 1/33307 358/1.15 |
| 2010/0161924 A1 * | 6/2010 | Sasage | G06F 3/061 711/171 |

(Continued)

*Primary Examiner* — Tarek Chbouki

(74) *Attorney, Agent, or Firm* — Kowert, Hood, Munyon, Rankin & Goetzel, P.C.; Mark D. Seegers; Dean M. Munyon

(57) ABSTRACT

Techniques are disclosed relating to managing virtual data sources (VDSs), including creating and using VDSs. A virtual data source manager (VDSM) that is executing on a computer system may receive a request to generate a bitmap index for a dataset. The VDSM may then generate a bitmap index by ingesting the dataset into a data format of the bitmap index. The VDSM may further generate the bitmap index by performing a compression procedure on the ingested dataset to generate a plurality of data containers, where a given data container includes a respective compressed portion of the ingested dataset. After compressing the ingested dataset, the VDSM may then store the plurality of data containers in a set of binary trees (b-trees), where the set of b-trees is usable to respond to data requests for data of the bitmap index.

19 Claims, 25 Drawing Sheets

600

Receiving Virtual Data Source (VDS) Creation Request to Create Particular VDS
610

Using, in Response to VDS Creation Request, Ingestion Routine to Create Particular VDS That Includes Bitmap Index That is Representative of Data Stored at Origin
620

(56) References Cited

U.S. PATENT DOCUMENTS

| | | | |
|---|---|---|---|
| 2012/0173540 A1* | 7/2012 | Kirk | G06F 16/2255 |
| | | | 707/745 |
| 2014/0095471 A1 | 4/2014 | Deshmukh et al. | |
| 2014/0101130 A1 | 4/2014 | Kang et al. | |
| 2015/0143064 A1* | 5/2015 | Bhargava | G06F 11/1464 |
| | | | 711/162 |
| 2018/0034824 A1* | 2/2018 | Maycotte | G16H 10/60 |
| 2018/0260125 A1* | 9/2018 | Botes | G06F 3/065 |
| 2019/0362001 A1* | 11/2019 | Thallam Kodandaramaih | |
| | | | G06F 16/2358 |
| 2021/0133203 A1* | 5/2021 | Rajavel | G06F 9/54 |

* cited by examiner

```
                    800
                   ↙

┌─────────────────────────────────┐
    │  Creating Virtual Data Source (VDS) │
    │   Based on Corresponding Origin     │
    │              810                    │
    └─────────────────────────────────┘
```

DATA STORAGE USING ROARING BINARY-TREE FORMAT

RELATED APPLICATIONS

The present application claims priority to U.S. Provisional Appl. No. 63/192,426, filed May 24, 2021; the disclosure of which is hereby incorporated by reference herein in its entirety. To the extent that the incorporated material contradicts material expressly set forth herein, the expressly set forth material controls.

BACKGROUND

Technical Field

The present disclosure relates generally to data virtualization and, more specifically, to an architecture for storing data of virtual data sources using a binary tree format.

Description of the Related Art

While there has been a growth in big data in recent years, the promise of improved decision making based on this data has largely been unrealized. By one estimate, business decisions (whether made by humans or machines) are being made based on only one percent of extant data. Many business intelligence projects, big-data driven applications, and artificial intelligence and machine learning initiatives are failing in part due to lack of access to data. It has been estimated that as much as $400+ billion in potential business value is currently locked in so-called "dark" (i.e., inaccessible) data.

Additionally, there is frequently a large amount of copying of data in organizations between an original data repository and the point at which a decision is made. It is estimated that as much as 85% of all data by volume is a copy that results from pre-processing, pre-joining, and aggregating disparate data into data formats and structures that are more performant for analytical purposes than the source systems. For example, original data is often extracted in batch processes, transformed, and copies loaded (ETL) into analytical data lakes, OLAP cubes, and materialized views so that it can be combined and organized to make it more easily analyzable. Additionally, original data is frequently copied across multiple repositories located in different geographic regions to fulfill jurisdictional requirements. Sometimes data is copied from edge locations containing sensors into central locations so that it can be combined with the relevant metadata needed to properly make decisions from the sensor readings. In other cases, this copying process is undertaken to move data closer to users and applications in different geographic regions around the world in order to make it more performant. Copying information from one traditional data repository to another can be very bandwidth intensive and a slow process as the information is usually not formatted (or compressed) in a manner that reduces the size of that information. This copying results not only in increased security risk, but also in a high additional cost in storing multiple copies or data and transporting it across networks.

DETAILED DESCRIPTION

Figure 1A:
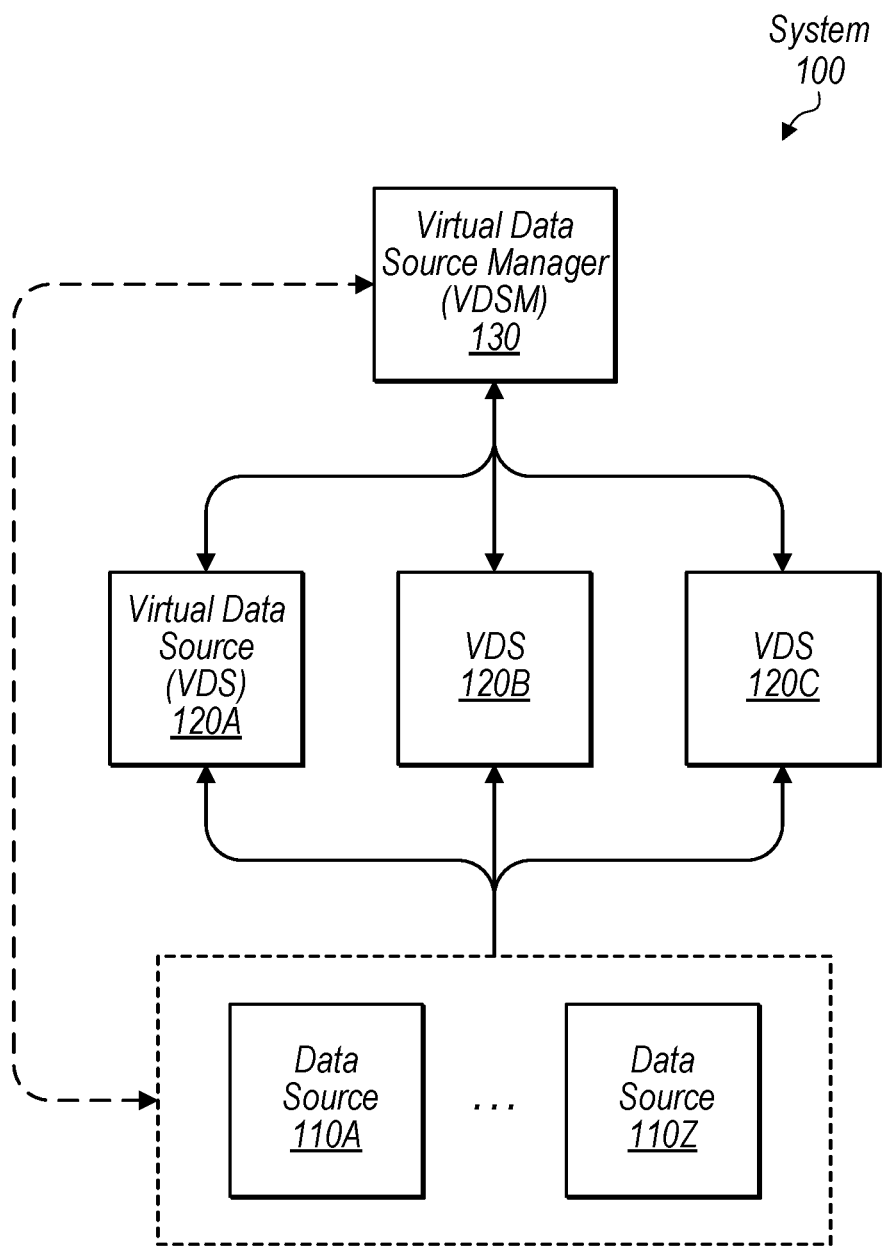
FIG. 1A is a block diagram illustrating example elements of a system that includes a virtual data source manager (VDSM) that is capable of managing virtual data sources (VDSs), according to some embodiments.

One approach for reducing information size and the amount of time needed to process certain requests for information is to store that information in a different format than traditional database tables. Pilosa® includes an open-source project that provides software for storing a data repository using a set of bitmap indexes. Bitmap indexes can be space efficient and allow for quick bitwise operations against the underlying information. As a result, various cases, such as the one posed above, may take milliseconds to implement instead of seconds, minutes, hours, or sometimes days, significantly speeding up the operation of the system. Such systems are described, for example, in U.S. Pat. Nos. 9,280,780; 9,489,410; and 9,607,104.

The present disclosure describes various techniques for implementing an infrastructure that allows data representations such as bitmap indexes to be scaled in order to manage vast amounts of data, as well as to perform a wider variety of functionality. In various embodiments, such a system includes a virtual data source manager (VDSM) that manages virtual data sources (VDSs) that include data representations, such as bitmap indexes, stored in corresponding underlying, or original, data sources. For example, a VDS may include a bitmap index that is representative of data stored in a relational database. The VDS may further directly include or leverage external translation key metadata that allows for the format of the bitmap index to be interpreted so that data can be extracted from the bitmap index.

A VDS may also be thought of in some embodiments as a "feature store" in that it stores "features." In certain fields, including machine learning, a feature is an individual measurable property or characteristic of an entity, object, or phenomenon. A bitmap index is sometimes organized as storing attributes (features) in columns for objects/entities/phenomena that correspond to rows in the index. A feature thus corresponds to a specification of an attribute and its value. A "feature vector" is an ordered set of features for an entity, and a "feature set" is a list of all attributes of interest at a particular time. Raw data that has been collected, organized and curated in this manner for a particular purpose (e.g., business intelligence) can be said to constitute a feature store.

A VDS may be created by a VDSM in response to receiving a request via an application programming interface (API) of the VDSM. In some embodiments, the VDSM provides a user interface that enables a user such as a system administrator to select from various options when creating, copying, importing, or linking a VDS. For example, the user might select an original data source for the VDS from a list of data sources. The user interface may then send a request to create a VDS via the VDSM's API. In some embodiments, the request to create the VDS includes information that identifies a corresponding original data source and a configuration for ingesting data from that data source into the data structure (e.g., a bitmap index) of the VDS. Based on that information, the VDSM may instantiate an ingestion plugin that ingests data from the original data source into a format that can be stored in the data structure of the VDS.

Once the VDS has been created, the VDSM may begin processing data requests against the VDS instead of the underlying data source—data requests may be made and processed as the VDS is being populated with data. The data requests may be received via the API and may specify SQL queries (or other types of queries) to be executed. In some embodiments, the VDSM translates and optimizes queries directly or through its query planner into a query language understood by VDSs and then routes those translated queries to the appropriate VDS(s). The VDSM may further maintain metadata about the data that is stored at its VDSs so that the VDSM can determine which VDSs should receive a query being routed by the VD SM.

In some embodiments, the VDSM maintains a software plugin repository that includes various executable software routines that may operate on data moving into a VDS (ingest data), data moving out of a VDS (outgest data), and data at rest in VDS. When a VDS is being created, the VDS may be associated with a set of software plugins that the VDSM may use to manage that VDS. As an example, if a VDS is being created based on an Oracle® database (an original data source), then the VDSM may instantiate an ingestion plugin that is designed for ingesting data from Oracle® databases. Software plugins may also be added/associated to a VDS during its lifecycle.

The various components (e.g., VDSs, software plugins, etc.) that are managed by the VDSM may be instantiated using resources managed by the VDSM, in various embodiments. Consider an example in which the VDSM manages a pool of compute nodes. The VDSM may instantiate an API server on one of the compute nodes, a web server on another compute node, and three VDSs on multiple compute nodes. The VDSM may also scale up and down the resources that are assigned to a component based on various criteria, such as processing demand. For example, if the VDSM receives a high volume of requests for data in a certain VDS, then the VDSM may distribute that VDS across additional compute nodes.

The VDSM may implement various other functionality to facilitate the management of VDSs. For example, in various embodiments, the VDSM implements access control directly or through a software plugin to restrict who/what can interact with the VDSs. In addition to managing VDSs, the VDSM may manage and link to other VDSMs—this results in hierarchies of VDSMs. For example, an upstream VDSM may manage multiple downstream VDSMs that are located in different data centers. One of those downstream VDSMs may manage VDSs that serve as regionally located VDSs that are managed by another one of those downstream VDSMs. Accordingly, the upstream VDSM may ensure that all or a selection of the data is replicated between the two downstream VDSMs. (Exemplary selective data sharing techniques are described, for example, in U.S. Publication No.: 2018/0034824.) VDSMs may be linked with other VDSMs belonging to a single company and its subsidiaries or interconnected to VDSMs that belong to other companies.

These techniques may be advantageous as they allow for data structures, such as bitmap indexes, that "virtualize" data from an underlying data source to be managed and exploited by other software routines. As mentioned, bitmap indexes are usable to process certain data requests in a shorter amount of time than processing those data requests against a traditional database. But those bitmap indexes are ineffectual without an infrastructure to create, manage, and use those bitmap indexes, especially on a reasonably large scale. The techniques of the present disclosure provide that infrastructure with the use of VDSs and VDSMs that manage those VDSs so that bitmap indexes (or similar data structures) can be readily built on underlying data sources and used to operate on the represented data. By using VDSMs and VDSs, data can be accessed and operated on from different locations without having to create a copy of the underlying data at the different locations. As a result, this data abstraction-based approach (or alternatively, data representation-based approach) can yield up to 100× reduction in hardware footprint and data movement. This approach simplifies, accelerates, and improves control over data both within an organization and outside the organization if it is sharing the data externally with partners and vendors. The various topologies of VDSMs and VDSs enable users to access data wherever they need to access it, on premises, in the cloud, or on the edge, regardless of where the original data resides. This greatly reduces data migration costs and complexity, along with the risks typically associated with approaches that involve copying (lifting and shifting) data to where the user needs it.

The techniques of the present disclosure further overcome various deficiencies of other approaches for preparing, accessing, and analyzing data, such as a query federation approach, a data aggregation approach, and a brute force approach. In the query federation approach, a federated database system acts as a type of meta-database management system (Meta-DBMS) that provides a unified access interface to multiple, independent database systems. Each of the independent database systems can implement a different type of database (e.g., SQL database, NoSQL database, etc.) with different query languages. When a request for data is received, the federated database system obtains data from the independent database systems as the federated databases of the federated system do not store any actual data from those independent database systems. The performance of the federated database system is dependent on the speed of each of the independent database systems, thus the overall performance of the composition is only as fast as the slowest system. The techniques of the present disclosure, however, provide for a system that can maintain data representations of data stored at different underlying databases and can obtain requested data from the data representations without having to request the data from the different underlying databases. The data representations can collectively make use of the same data format, which can allow for more efficient access and analysis of the data. As such, the "data virtualization" approach described by the present disclosure is not dependent on the speed of the underlying databases unlike in the query federation approach.

In the data aggregation approach, data is physically merged from several independent databases into one central database. This approach usually involves integrations (ETL), batch processes, the pre-computation of derivative results, multiple copies of the original data, and a movement of all the data (being aggregated) across a computer network. Because the central database is normally very large in volume, query performance is a significant issue and requires further caching or loading of data into multidimensional datasets (OLAP cubes) to facilitate analysis. The techniques of the present disclosure, however, provide for a system that can manage, at a first computer network, data representations of data that is stored at an underlying database without having to move a copy of that data from a second computer network to the first computer network. Furthermore, these data representations can maintain data in a format that reduces the size of that data relative to the corresponding data that is stored at the underlying database. As a result, large amounts of data do not have to be moved across a computer network and the smaller size of the data representations allows for more efficient query performance.

Brute force approaches are usually implemented either by deploying complex data and analytical infrastructure or by applying specialized, high-performance hardware to process large volumes of computationally intensive data. The deployment of complex data and analytical infrastructures usually involves significant upfront and ongoing labor from data engineering and data operations teams. Additionally, the underlying techniques for preparing data for analysis are no different than the techniques that are used in the data aggregation and query federation approaches, and thus suffer from the same drawbacks.

Figure 1B:
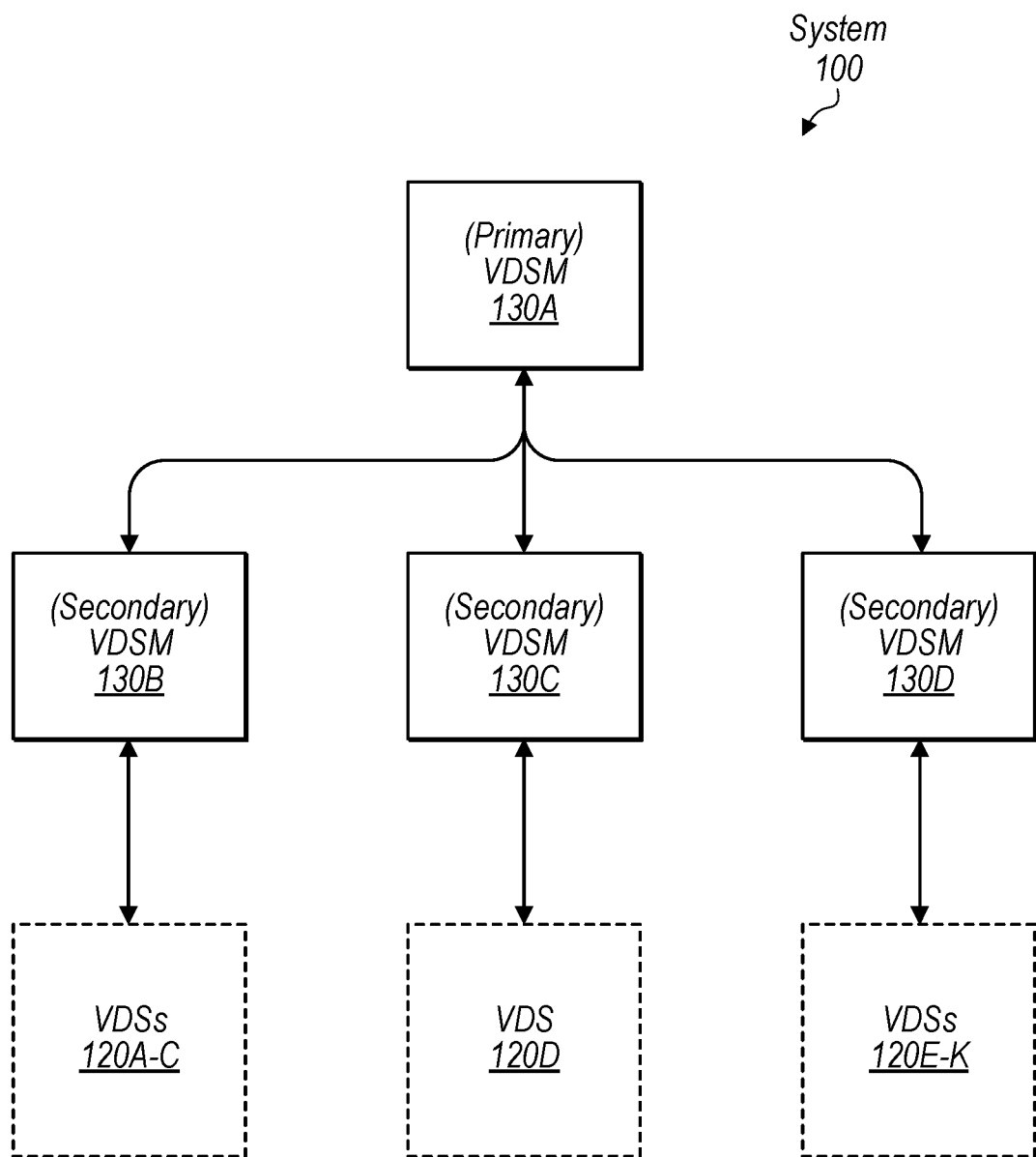
FIG. 1B is a block diagram illustrating example elements of a hierarchy of VDSMs, according to some embodiments.

Turning now to FIG. 1A, a block diagram of an example system 100 is shown. System 100 includes a set of components that may be implemented via hardware or a combination of hardware and software routines. In the illustrated embodiment, system 100 includes original data sources 110A-Z, virtual data sources (VDSs) 120A-C, and a virtual data source manager (VDSM) 130. In some embodiments, system 100 may be implemented differently than shown. As shown in FIG. 1B for example, system 100 may include a hierarchy of VDSMs 130 in which an upstream VDSM 130 controls a set of downstream VDSMs 130. FIG. 1D illustrates various possible topologies by which original data source(s) 110 are connected to VDS(s) 120.

Data sources 110, in various embodiments, are entities that serve as sources of data that are accessible by other entities. In some cases, a data source 110 may be a database comprising a collection of information that is structured and organized in a manner that allows for access, storage, and manipulation of that information. For example, a data source 110 may be a non-relational database (e.g., MongoDB®), a relational database (e.g., an Oracle® database), or an application programming interface (e.g., Salesforce.com®) that stores information on a single or multiple storage devices that are connected together on a network. That data source 110 may be available to an application server that accesses data from that data source 110 in order to generate content that may be presented to a user. In some cases, a data source 110 may be a system that collects information about an environment and/or from another system. For example, a data source 110 may be an embedded system within a cell tower that collects information about the operation of that cell tower (e.g., information about whether the cell tower is operating correctly). As another example, a data source 110 may be a system within a smartwatch that collects information about a user's health and location. In some cases, a data source 110 may be a stream/pipeline to which messages are published and consumed as part of a stream-processing platform. For example, a data source 110 may be a Kafka® topic that is part of a Kafka® cluster.

Virtual data sources (VDSs) 120 stand in contrast to original data sources 110. A "virtual data source," as used herein, refers to a software construct that includes a representation of data stored in one or more (original) data sources, as well as metadata that identifies the VDS to a higher-level software manager entity. These components are discussed further in the context of FIG. 2A below, which illustrates data representation 210, VDS API 222, and VDS metadata 230. One example of the higher-level software entity that manages a VDS 120 is VDSM 130.

Various topologies between original data sources 110 and VDSs 120 are contemplated. In FIG. 1A, VDS 120A may be a representation of original data source 110A that is created directly from source 110A. In other embodiments, such as those shown below in FIG. 1D, a VDS 120 may be connected to original data source 110 via one or more intermediate VDSs 120. Also, a VDS 120 may be created based on multiple original data sources 110. Still further, one VDS 120 may be created as a subset of data from another VDS 120. For example, a first VDS 120 might correspond to worldwide business data, while a second VDS 120 might be derived from the first VDS 120 to include only North American business data.

As an example of the representation of data stored in another data structure, VDS 120A may include a bitmap index (that is representative of data stored in a relational database) and translation key metadata that indicates how information is organized in the bitmap index. (Examples of bitmap index implementations are discussed in greater detail in U.S. Publication No. US 2015/0213463 A1, which is incorporated by reference herein in its entirety). The translation key metadata may be usable to interpret the bitmap index so that requested data can be accessed and operated on. Other data representations are contemplated. For example, a VDS 120 may include other new and unique data formats or existing data formats, such as key-value stores (e.g., Redis® or DynamoDB®) or time-series databases (e.g., Influx DB®).

In various embodiments, a VDS 120 also includes software routines that are executable to maintain and operate on its data representation (e.g., a bitmap index), including processing queries against that data representation. For example, VDSM 130 may send a request to VDS 120A for data in its data representation. That request may include a query that is processed by the software routines of VDS 120A to return a response that includes the requested data. As discussed in more detail with respect to FIG. 2A, the software routines of a VDS 120 implement an API that allows for entities, such as VDSM 130, to send requests down to that VDS 120. In various embodiments, this API enables an ingestion routine (which may be initiated by VDSM 130) to push ingested data into the data representation of a VDS 120.

A VDS 120 may include additional metadata to facilitate the flow of data into and out of the VDS 120. This metadata may include, for example, source information that identifies an underlying data source 110 (or another VDS 120) and authentication credentials for enabling access to data from that data source 110 so that it can be ingested into the data representation of the corresponding VDS 120. Examples of metadata that can be included in a VDS are discussed in greater detail with respect to FIG. 2B.

Virtual data source manager (VDSM) 130, in various embodiments, is a set of software routines executable to manage one or more VDSs 120. Managing VDSs 120 may include, for example, creating the VDSs 120, ensuring that the data stored in those VDSs 120 is up to date, requesting data from those VDSs 120, instantiating software routines (plugins) that operate on data of those VDSs 120, and controlling access to those VDSs 120. In various embodiments, VDSM 130 includes metadata about the VDSs 120 that it manages that enables VDSM 130 to perform those enumerate functions. This metadata is discussed in greater detail with respect to FIG. 3.

As shown, VDSM 130 manages three VDSs 120A-C storing data that is representative of data stored in underlying data sources 110. Initially, VDSM 130 may start with creating one of the VDSs 120 (e.g., VDS 120A) and then may add subsequent VDSs 120 (e.g., VDS 120B and 120C) over time to its configuration, arriving at the illustrated embodiment. In some cases, when adding a VDS 120 to its configuration, VDSM 130 may create that VDS 120. This may involve supplementing information (e.g., a location corresponding to an underlying data source 110) provided by a user or agent with information (e.g., a transfer protocol) that is obtained by communicating with the corresponding underlying data source 110. (This is illustrated by the dotted line connecting VDSM 130 with data sources 110). VDSM 130 may then instantiate an ingestion routine that ingests data from the corresponding underlying data source 110 into the VDS 120. In some cases, when adding a VDS 120 to it configuration, VDSM 130 may load a previously created VDS 120 that had been temporally stored.

In some cases, VDSs 120A-C may be created based on different data sources 110. For example, VDS 120A may be created based on a relational database operated by a first company while VDS 120B is created based on a non-relational database operated by a second, different company. In some cases, some of VDSs 120A-C may be created based on the same data source 110 but correspond to different data partitions of that data source 110. For example, VDS 120A may correspond to data of a first tenant while VDS 120B corresponds to data of a second tenant that is associated with the same database.

After adding a VDS 120 to its configuration, VDSM 130 may start issuing requests for data against that VDS 120 instead of the corresponding data source 110. As a result, the VDS 120 may act as a "virtual" layer between VDSM 130 and the corresponding data source 110 that virtualizes the data from that data source 110. Virtualizing data from the data source 110 may involve the VDS 120 storing data in a different format (e.g., in a bitmap-based format instead of a table-based format) that still conveys the same information as the data that is stored in the underlying data source 110. By using the different format, VDSM 130 may be able to process certain requests for information against its VDSs 120 instead of the underlying data sources 110.

Turning now to FIG. 1B, a block diagram of a hierarchy of VDSMs 130 within system 100 is shown. In the illustrated embodiment, system 100 includes a "primary" VDSM 130A, "secondary" VDSMs 130B-D, and VDSs 120A-K. As further depicted, VDSM 130B manages VDSs 120A-C, VDSM 130C manages VDS 120D, and VDSM 130D manages VDSs 120E-K.

In some embodiments, system 100 may be implemented differently than shown—e.g., system 100 may not include a hierarchy of VDSMs 130 as shown in FIG. 1A.

As illustrated, a VDSM 130 can manage one or more VDSMs 130. As used herein, the term "primary VDSM" refers to the VDSM 130 that resides at the top of a hierarchy of VDSMs 130, the term "secondary VDSM" refers to a VDSM 130 that resides in the next level down in that hierarchy, and the term "tertiary VDSM" refers to a VDSM 130 that resides in the yet next level down. While not shown, in some embodiments, a VDSM 130 may manage a combination of VDSs 120 and VDSMs 130 that reside in the next level down from that VDSM 130.

A VDSM 130 may manage multiple VDSMs 130 for various reasons. In some cases, a company may wish to have data replicated across multiple locations to ensure high availability of that data or to enable data access at an edge location. Accordingly, a secondary VDSM 130 may be placed at each location that manages a set of VDSs 120 that store data representing a copy of the data being partially or fully replicated. The primary VDSM 130 may communicate with those secondary VDSMs 130 to facilitate the exchange of data between them in order to ensure that data is replicated between the different locations. In some cases, a company may wish to collect particular information from multiple devices (e.g., Internet of Things devices) that are scattered across a geographic region. As such, a secondary VDSM 130 may be instantiated on each device and manage a set of VDSs 120 that are created based on data collected by components of that device. The secondary VDSMs 130 may further instantiate software plugins that perform an analysis on the data using the VDSs 120. A result of the analysis may be pushed up to the primary VDSM 130 that stores the result using VDSs 120 managed by the VDSM 130—the primary VDSM 130 may serve as a central location for collecting results to present to a user.

Figure 1C:
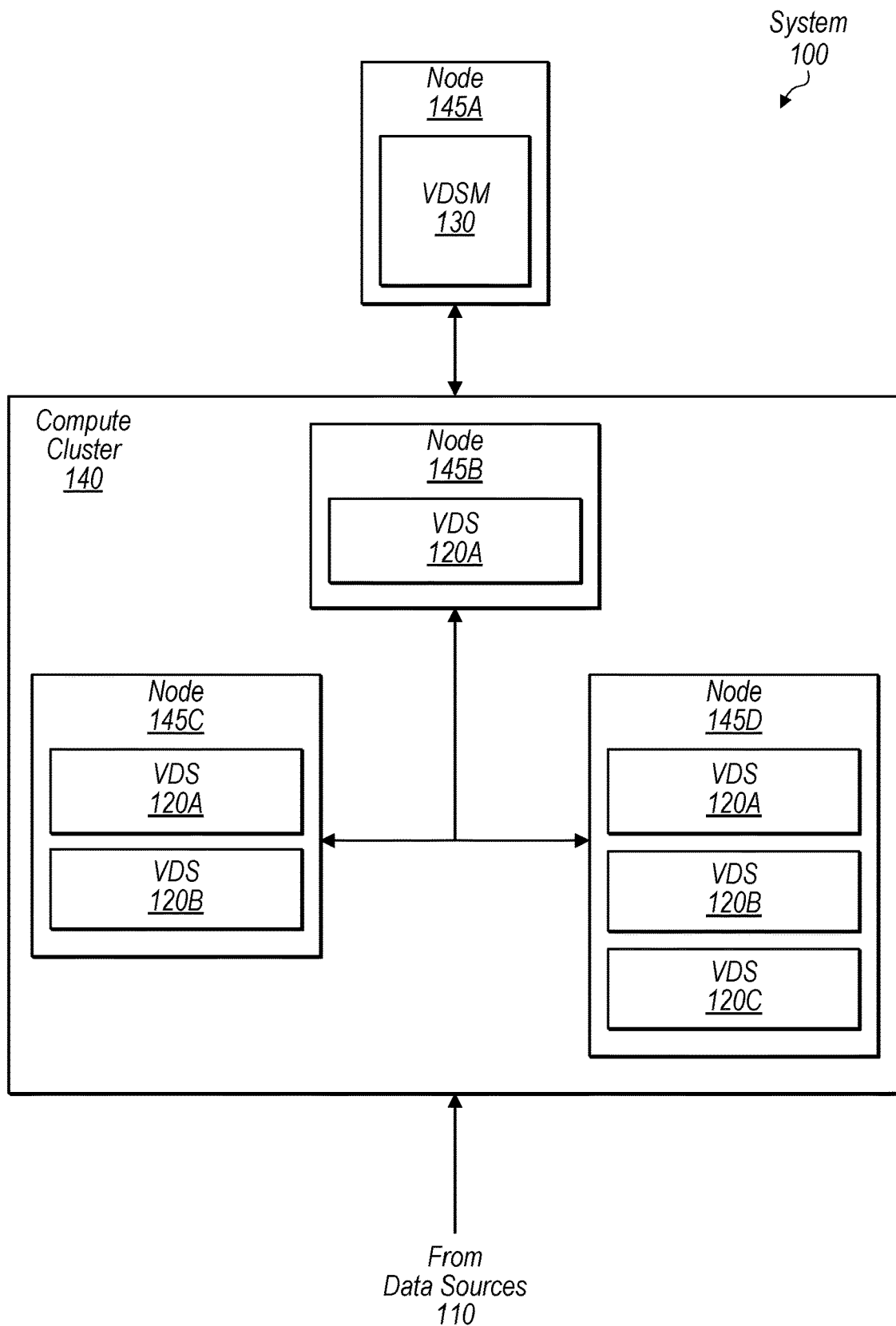
FIG. 1C is a block diagram illustrating example elements of a layout of components of the system on nodes of a compute cluster, according to some embodiments.
Figure 1D:
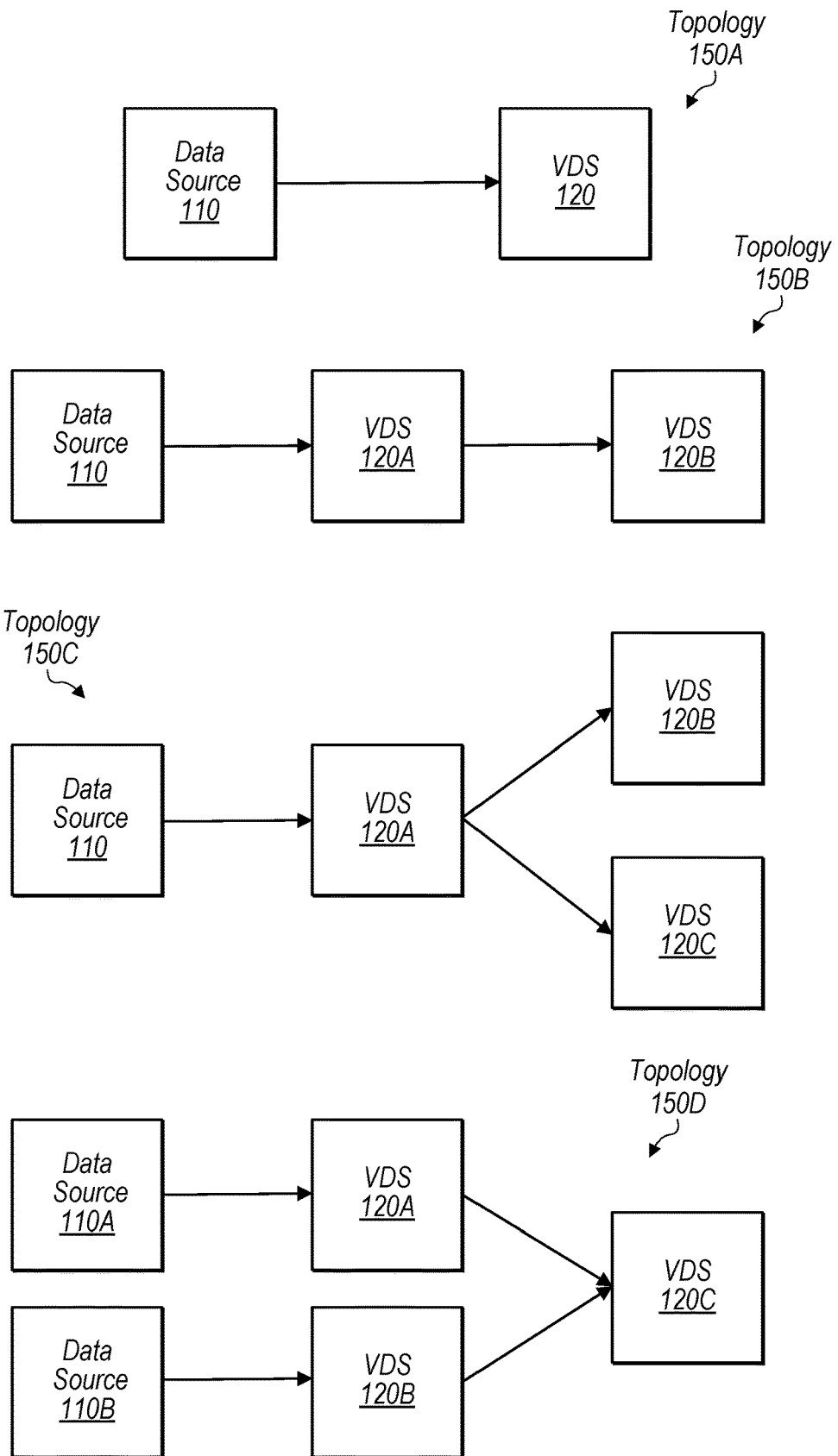
FIG. 1D is a block diagram illustrating example topologies between data sources and VDSs, according to some embodiments.

Turning now to FIG. 1C, a block diagram of an example layout of components of system 100 on nodes 145 is shown. In the illustrated embodiments, system 100 includes a node 145A and a compute cluster 140 having nodes 145B-D. As further illustrated, node 145A includes a VDSM 130, node 145B includes VDS 120A, node 145C includes VDS 120A and 120B, and node 145D includes VDSs 120A-C. In some embodiments, system 100 may be implemented differently than shown. For example, VDSM 130 might execute on a node 145 within compute cluster 140.

Figure 3:
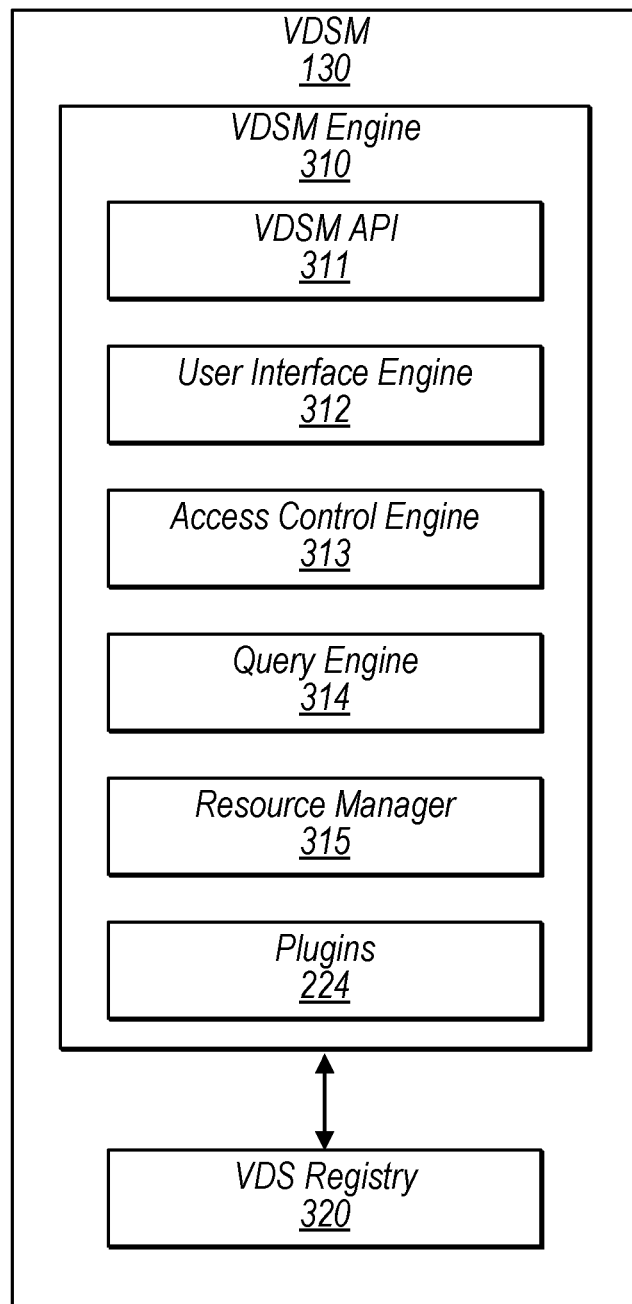
FIG. 3 is a block diagram illustrating example elements of a VDSM, according to some embodiments.

Compute cluster 140, in various embodiments, is a pool of resources managed and used by VDSM 130—this pool of resources may include resources that are managed by the resource manager discussed in more detail with respect to FIG. 3. Compute cluster 140 may be used to implement services of VDSM 130 (e.g., an API server) and a VDS environment having one or more VDSs 120. As shown, compute cluster includes nodes 145B-D. In various embodiments, a node 145 corresponds to a set of hardware processors, physical storage, network storage, and memory that is available to VDSM 130 for executing software routines and storing data. In some embodiments, a node 145 can be a virtual machine—this might provide VDSM 130 with less granular control than managing a set of hardware processors, storage, and memory. The resources of compute cluster 140 may correspond to resources that are managed by a different entity than the entity operating VDSM 130. For example, compute cluster 140 may correspond to servers and storage provided by AWS while VDSM 130 is operated by another party. In some embodiments, VDSM 130 may scale up and down the resources that are included in compute cluster 140.

As explained, VDSM 130 may execute software routines (e.g., API servers, VDSs 120, etc.) using the resources of compute cluster 140. In various embodiments, a portion or all of a VDS 120 can be compiled into an executable binary that can be executed on one or more nodes 145 to together implement the VDS 120. Those binaries may be operable to communicate with each other to implement functionalities of that VDS 120, such as a join query operation. As shown for example, VDS 120A executes on three nodes 145 while VDS 120C executes on only one node 145 (i.e., node 145D). When a VDS 120 is distributed across multiple nodes 145, the data of that VDS 120 may be partitioned into segments/slices/shards/partitions that are distributed across those nodes 145. Consider an example in which VDS 120C includes a bitmap index having 3000 columns, each of which may correspond to a user. VDS 120C might be partitioned such that node 145B manages the data of columns 1-1000, node 145C manages the data of columns 1001-2000, and node 145D manages the data of columns 2001-3000. In some embodiments, the metadata that is associated with a VDS 120 may be replicated across multiple nodes 145 such that each node 145 stores a copy of that metadata. For example, VDS 120C may include translation metadata that allows for the bit strings of its bitmap index to be interpreted so that data can be accessed and operated on. This translation metadata can be replicated to nodes 145B-D so that they all have their own respective copy.

Turning now to FIG. 1D, a block diagram of example topologies between original data sources 110 and VDSs 120 are shown. In the illustrated embodiment, topology 150A includes a VDS 120 that is created directly from an original data source 110. In this case, that original data source 110 is an "origin" of data for that VDS 120—the data source that is directly used to create the VDS. In some cases, the origin of a VDS 120 is an "original" data source 110, as in topology 150A, yet in other cases, the origin of a VDS 120 may be a "derived" data source 110, such as another VDS (e.g., belonging to a research partner) that is derived from an original data source 110, as in topology 150B. A VDS 120 may also have more than one origin in some cases.

Topology 150B, for example, includes a VDS 120B that is connected to an original data source 110 via an intermediate VDS 120A. Within the context of topology 150B, while VDS 120B is connected to data source 110, VDS 120A is the origin of data for VDS 120B, not data source 110. That is, VDS 120B obtains its data directly from VDS 120A and not data source 110 and thus VDS 120A is the origin of data. In some cases, VDS 120B may be a copy of VDS 120A—e.g., VDS 120A might be a United States-based VDS 120 while VDS 120B is a European counterpart. As further shown, topology 150C includes two VDSs 120B and 120C that are connected to an original data source 110 via the same intermediate VDS 120A. For example, VDS 120A might include business data for the entire United States while VDS 120B might include the business data for California and VDS 120C includes the business data for Texas. As further shown in the illustrated embodiment, topology 150D includes a VDS 120C that is connected to two original data sources 110A and 110B via two respective VDSs 120A and 120B that are the origins of data for VDS 120C. Other topologies 150 are contemplated. As an example, a topology 150 may include a series of VDSs 120 (e.g., eight VDSs 120) in which a given VDS 120 of the series is an origin of data for the next VDS 120 in that series. In short, the various topologies indicated in FIG. 1D, which are by no means exhaustive, illustrate how a VDS can be connected to an original data source in various ways—either directly (no intermediate VDSs) or indirectly (via one or more intermediate VDSs).

Figure 2A:
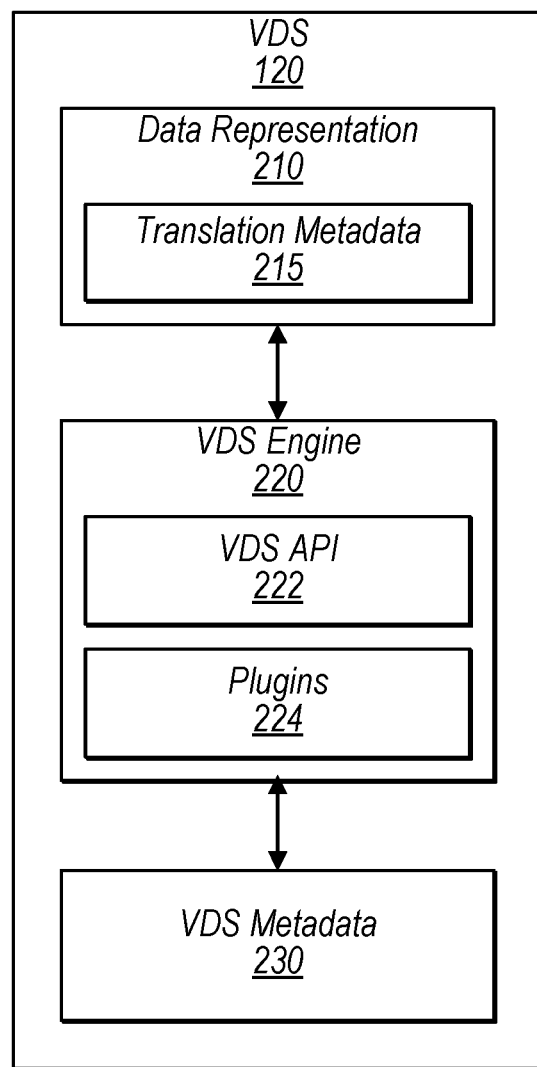
FIG. 2A is a block diagram illustrating example elements of a VDS, according to some embodiments.

Turning now to FIG. 2A, a block diagram of an example VDS 120 is shown. In the illustrated embodiment, VDS 120 includes data representation 210, a VDS engine 220, and VDS metadata 230. As shown, data representation 210 includes translation metadata 215, and VDS engine 220 includes a VDS API 222 and plugins 224. In some embodiments, VDS 120 may be implemented differently than shown. For example, VDS 120 may not include plugins 224.

Data representation 210, in various embodiments, is a data structure that stores data that is representative of data stored at one or more original data sources 110. Data representation 210 may store its data in a different format than the data stored at the original data sources 110. For example, data representation 210 may be a bitmap index comprising multiple rows of bit strings. The bits within a given row may be set based on data in the original data sources 110. Consider an example in which an original data source 110 includes a table of user profiles, each of which identifies the gender of its corresponding user. Data representation 210 may include a bitmap index of users, where the bitmap index includes at least two rows: a bit string corresponding to the gender "male" and a bit string corresponds to the gender "female." Each column of the bitmap index may correspond to a user. Consequently, if a user is a female, then the corresponding bit of the "male" bit string is set to "0" and the bit of the "female" bit string is set to "1." While the user profile table of the original data source 110 may store a character string of "female" and the user bitmap index may include a set bit, they both convey the same information (i.e., the gender of the user), but in different data formats. In this manner, data representation 210 may store data that is representative of data stored at the original data source 110.

Translation metadata 215, in various embodiments, includes information that enables the data of data representation 210 to be interpreted. Translation metadata 215 may include, for example, value keys, record keys, and record attributes. Continuing with the example about the two bit strings that correspond to the two genders. The bitmap index of users may include thousands of bit strings (which include the two bit strings for gender) that are grouped together to form a matrix of columns and rows. Translation metadata 215 may indicate the meaning of each bit string that makes up the bitmap index of users. For example, translation metadata 215 may include a value key "male" that is linked to the bit string corresponding to whether a user is a male and a value key "income greater than 10 k" that is linked to a bit string corresponding to whether a user's income exceeds $10,000. In various embodiments, translation metadata 215 categorizes record keys into groups. For example, those two previously mentioned value keys may be grouped under "demographic data." Record keys may define a mapping between bit positions of a bit string and a corresponding record. For example, a record key may indicate that the first bit of a bit string (or the first bit of a portion or all bit strings in the bitmap index) corresponds to user "A". Record attributes may specify information associated with a record (column) that is not represented by a bit string. For example, email addresses are often unique values and as a result, it might not be desirable to represent them using a bit string; however, it may still be desirable to associate a record with an email address. As such, a record attribute may specify an email address for a record, such as the record corresponding to user A.

As mentioned, translation metadata 215 may be replicated across each node 145 that is implementing VDS 120. For example, as depicted in FIG. 1C, VDS 120A is distributed among nodes 145B-D. This distribution may be such that each node 145 manages a slice/segment of data representation 210 of VDS 120A (e.g., each node 145 may manage a different set of columns of a bitmap index). In some embodiments, a node 145 maintains, for its portion of a distributed VDS 120, only the translation metadata 215 that is relevant to its slice. In various embodiments, however, a node 145 maintains a complete copy of the translation metadata 215 (or a portion thereof—e.g., only the value keys may be copied) that pertains to the entirety of data representation 210.

As updates are made to the data of data representation 210 (e.g., based on changes to data at the origin, such as an underlying data source 110 or another VDS 120), VDS engine 220 may modify translation metadata 215 based on those updates. For example, if a new bit string is added to data representation 210 (in the case where it is a bitmap index), a value key may be added to translation metadata 215 to indicate the meaning of the new bit string (e.g., "users with a dog"). The changes that are made to translation metadata 215 may be propagated to each node 145 that implements the corresponding VDS 120.

VDS engine 220, in various embodiments, includes the executable software routines of VDS 120 that are capable of facilitating access and manipulation of data representation 210 and VDS metadata 230. VDS engine 220 may further maintain data representation 210 and VDS metadata 230 by ensuring that changes to data at the origin for VDS 120 (e.g., an original data sources 110) are reflected in index 210 and metadata 230. As illustrated, for example, VDS engine 220 includes VDS API 222 and plugins 224.

VDS API 222, in various embodiments, is an interface provided by VDS engine 220 to allow for entities (e.g., VDSM 130) that are outside of VDS 120 to access and manipulate the components within VDS 120. In various embodiments, VDS API 222 includes a set of query functions that are invokable to query data representation 210 for data. Consequently, a data request received by VDSM 130 for particular data may be propagated down to the appropriate VDSs 120 via calls to the query functions of VDS API 222. In various cases, VDSM 130 may invoke the query functions of one of the VDSs 120 that is selected by VDSM 130. The selected VDS 120 may then propagate queries from VDSM 130 to the remaining VDSs 120 of compute cluster 140 via their VDS APIs 222.

Plugins 224, in various embodiments, are sets of software routines that are executable to perform a specified set of operations in relation to VDS(s) 120 and/or VDSM(s) 130. Plugins 224 may generally fall within one of three types of categorizations (although, there are others): ingest plugins 224 that operate on data moving into VDS 120, consumption plugins 224 that operate on data moving out of VDS 120, and at-rest plugins 224 that operate on data at rest within VDS 120. Ingest plugins 224, consumption plugins 224 (alternatively, "outgest" plugins), and at-rest plugins 224 are discussed in greater detail with respect to FIGS. 4A, 4B, and 4C. Other types of plugins 224 can include monitoring plugins 224 that may collect metrics about the operation of a VDS 120 and security plugins 224 that may enforce security policies, execute access control directives, encrypt data, and/or generate secure connections between a VDS 120 and another component (e.g., another VDS 120).

In some embodiments, VDS 120 spawns plugins 224 in response to requests received via its VDS API 222 or based on a defined trigger event (e.g., detecting a change to particular data in data representation 210). In various embodiments, VDS 120 relies on VDSM 130 to spawn plugins 224 and instead stores metadata about the particular plugins 224 associated with VDS 120. In some embodiments, VDS 120 may store and spawn a subset of the plugins 224 associated with it while VDSM 130 may spawn other plugins 224 that are associated with VDS 120.

VDS metadata 230, in various embodiments, includes information that can be used to facilitate the movement of data into and out of VDS 120. For example, VDS metadata 230 may specify a location of an origin of data for VDS 120 (e.g., a data source 110), parameters for accessing data from that location, and/or a location at which to store data ingested from the origin. Examples of the different types of information that may be included in VDS metadata 230 are discussed in greater detail with respect to FIG. 2B. VDS metadata 230, in various embodiments, is accessible to entities outside of VDS 120. For example, an ingestion plugin 224 (which may be spawned by VDSM 130) may access or be provided VDS metadata 230 so that it can connect with an underlying data source 110 and begin ingesting data into data representation 210.

Figure 2B:
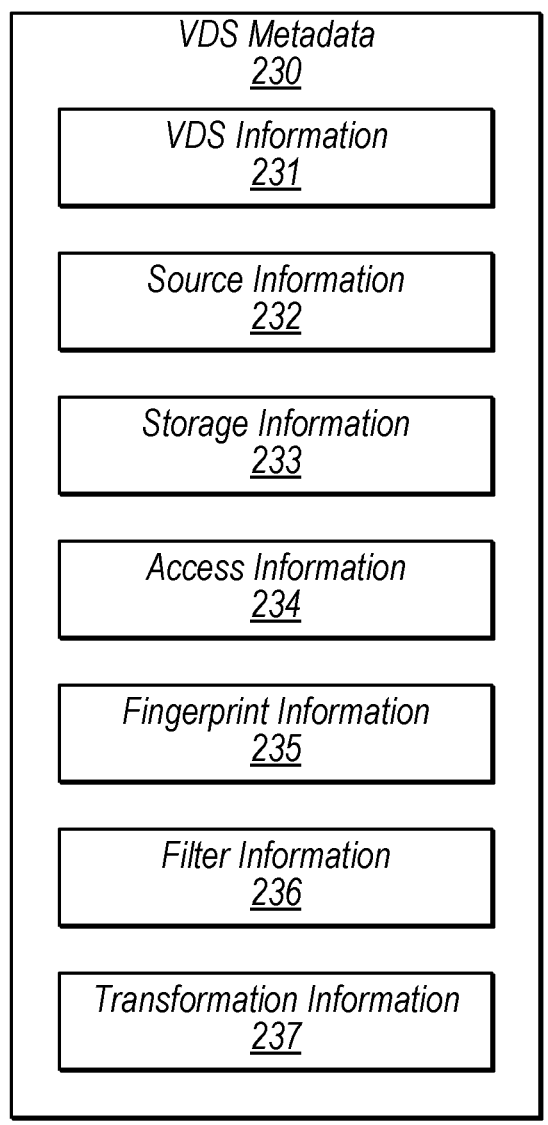
FIG. 2B is a block diagram illustrating example elements of VDS metadata, according to some embodiments.

Turning now to FIG. 2B, a block diagram of example VDS metadata 230 is shown. In the illustrated embodiment, VDS metadata 230 includes VDS information 231, source information 232, storage information 233, access information 234, fingerprint information 235, filter information 236, and transformation information 237. In some embodiments, VDS metadata 230 may be implemented differently than shown. For example, VDS metadata 230 may not include fingerprint information 235.

VDS information 231, in various embodiments, includes information describing one or more general properties pertaining to a VDS 120. VDS information 231 may specify a unique identifier that allows for the corresponding VDS 120 to be directly referenced separately from other VDSs 120. This unique identifier, in some embodiments, is assigned by VDSM 130 to a VDS 120 upon creation of the VDS 120. If a VDS 120 has a data source that is another VDS 120 (e.g., topology 150B in FIG. 1D), then those two VDSs 120 may be assigned different identifiers. VDS information 231 may specify a version associated with the corresponding VDS 120, a human-readable name separate from the unique identifier, and/or a text description of the VDS 120, which may be provided by a user.

Source information 232, in various embodiments, includes information describing the one or more origins (e.g., underlying data sources 110) whose data is represented by a data representation 210 of a VDS 120. As mentioned, when a user (e.g., an administrator) wishes to create a VDS 120, that user may identify, e.g., one or more underlying data sources 110 to be used to create the VDS 120—those underlying data sources 110 may be identified by another entity, such as a set of files stored in a database accessible to VDSM 130. VDSM 130 may then store information that it obtains about the underlying data sources 110 as source information 232 in the VDS 120 being created. In various embodiments, source information 232 enables VDSM 130 or another component (e.g., a plugin 224) to access data from those underlying data sources 110 so that the data can be operated in some manner. As discussed in FIG. 4A for example, an ingest plugin may use source information 232 to access the origin(s) of data for VDS 120 (e.g., underlying data sources 110 or VDSs 120) so that it can ingest data from those origins to create and/or maintain a data representation 210.

In some cases, source information 232 may specify an underlying data source 110 that corresponds to a storage service provided by a cloud platform. For example, source information 232 may specify one or more Amazon® S3 buckets that store files having data objects that can be parsed. Source information 232 may further specify authorization credentials that allow for access to that storage service. Continuing with the previous example, that source information 232 may specify an Amazon Web Service® (AWS) access identifier and access secret. Source information 232 may also specify a data format (e.g., JSON, CSV, etc.) of the data that is being accessed so that it can be correctly parsed.

In some cases, source information 232 may specify an underlying data source 110 that corresponds to a stream-processing platform in which messages are published to and consumed from streams (or alternatively, "pipelines"). For example, source information 232 may specify a host address of a Kafka® cluster, an identifier of a Kafka® topic (a pipeline), and/or a schema registry address. Source information 232 may specify a data format (e.g., JSON, Avro, etc.) of the data objects included in messages of a pipeline so that they can be correctly parsed.

In some cases, source information 232 may specify an origin that corresponds to a VDS 120—that is, one VDS 120 is the source of data for another VDS 120. When the two VDSs 120 are managed by the same VDSM 130, source information 232 may specify an identifier of the VDS 120 that is being used as an origin of data. If the source VDS 120 is managed by another VDSM 130, then source information 232 might specify, in addition to an identifier of the source VDS 120, an endpoint address for that other VDSM 130.

Other types of underlying data sources 110 than those discussed above may be specified by source information 232. For example, source information 232 may specify a local relational, non-relational database, or a remote API whose data can be ingested. In some embodiments, a VDS 120 can have multiple underlying data sources 110 that are of the same or different types. For example, a VDS 120 might be created based on an Amazon® S3 bucket and another VDS 120 or based on three VDSs 120.

Storage information 233, in various embodiments, includes information describing one or more locations where data of data representation 210 is stored. In various cases, storage information 233 may specify that the data of index 210 resides locally on compute cluster 140 or a data store managed by VDSM 130. In some cases, storage information 233 may specify a location that corresponds to a cloud storage service, such as AWS S3. The corresponding VDS 120 may not be actively loaded/running in compute cluster 140, but rather offloaded at the cloud storage service until requested—data may be loaded into compute cluster 140 to process certain requests and then offloaded back to the cloud storage service. In some cases, storage information 233 may specify a network-attached storage (NAS) where a VDS 120 can be offloaded while not being used and then reloaded at another time, similar to the cloud storage service approach. In some cases, storage information 233 may indicate the data files are currently bundled with the corresponding VDS 120—this may allow for the VDS 120 to be transferred to another compute cluster 140 without requiring any external connectivity (e.g., to a cloud storage service.)

Access information 234, in various embodiments, includes information describing who can access data from data representation 210 and what data can be accessed. For example, access information 234 might specify that a user A has access to columns 1-1000 and a user B has access to columns 1-2000 of a bitmap index. In some cases, access information 234 may simply specify who can access the corresponding data representation 210 without limiting the data that can be accessed. For example, access information 234 may specify that users A and B can access the corresponding data representation 210 while user C cannot.

Fingerprint information 235, in various embodiments, includes information that serves as a representation of a VDS 120 that may be used to determine if VDSs 120 are different. In some cases, fingerprint information 235 specifies metrics about the data of a data representation 210. Such metrics may include the number of rows and columns of the data representation 210 (if a bitmap index is used as index 210 for example), types of columns (e.g., integer, character, etc.), and the data density of data representation 210. In some embodiments, fingerprint information 235 specifies the mean, median, mode for defined list of columns.

Filter information 236, in various embodiments, includes information that identifies a mapping between the data of a VDS 120 and data of the corresponding origin of data (e.g., an underlying data source 110). The mapping may specify associations between data fields of the VDS 120 and data fields of the origin. Consider an example in which a data source 110 includes fields [A, B, C, D]. Filter information 236 may identify a mapping of [A, B, C, D]→[A, B, K, Z], where [A, B, K, Z] are data fields in the data representation 210 of the VDS 120. Filter information 236 may specify a field name for the VD S 120 that is different from the field name of the origin—e.g., [D]→[Z]. Filter information 236, in various embodiments, is usable to filter what data is selected from a data source 110. Continuing with the previous example, filter information 236 may identify a mapping of [A, B, C, D]→[A, B, D]. As a result, the data from the data field [C] of the origin is not included in the corresponding VDS 120.

Transformation information 237, in various embodiments, includes information that identifies a set of transformation to perform on data that is being ingested from the origin of data (e.g., an underlying data source 110) into the VDS 120. For example, transformation information 237 may specify a transformation from a value of a "birthday date" field of a data source 110 to an age value that can be stored in an "age" field of a VDS 120. In various cases, filter information 236 and transformation information 237 is accessed by an ingestion plugin 224 so that it can ingest data from a data source 110 into a corresponding VDS 120.

Turning now to FIG. 3, a block diagram of an example VDSM 130 is shown. In the illustrated embodiment, VDSM 130 includes a VDSM engine 310 and a VDS registry 320. As further illustrated, VDSM engine 310 includes plugins 224, a VDSM API 311, a user interface engine 312, access control engine 313, query engine 314, and resource manager 315. In some embodiments, VDSM 130 may be implemented differently than shown. For example, VDSM 130 may not include plugins 224.

VDSM engine 310, in various embodiments, includes the executable software routines of VDSM 130 that allow for VDSM 130 to manage one or more VDSs 120, including creating those VDSs 120 and processing data requests against them. In some embodiments, the software routines of VDSM 130 also enable VDSM 130 to manage one or more other VDSMs 130 of a hierarchy of components that include VDSs 120 and VDSMs 130. In some embodiments, the execution of VDSM engine 310 is distributed across multiple computer systems. For example, resource manager 315 may execute on a first node 145 while an API server, which implements VDSM API 311, executes on a second, different node 145.

VDSM API 311, in various embodiments, is an interface that allows for entities (e.g., a user, another VDSM 130, etc.) to access the functionality and information of VDSM 130 and its managed VDSs 120. In various embodiments, VDSM API 311 supports callable functions that include a create VDS function, a delete VDS function, a list VDSs function, a query VDS function, a backup VDS function, and a clone VDS function. The create VDS function may be callable to create a VDS 120 and may receive, as input, information that identifies an origin of data for that VDS 120 (e.g., an underlying data source 110) along with parameters (e.g., VDS metadata 230) for configuring an ingestion plugin 224 to ingest data from that origin into the data representation 210 of the VDS 120. In some cases, the create VDS function may load a previously created VDS 120 from a storage device into compute cluster 140—the create VDS function may receive the unique identifier for that VDS 120 as an input.

The delete VDS function may be callable to delete a VDS 120 or offload the VDS 120 from compute cluster 140 to a storage location—the delete VDS function may receive, as input, the unique identifier for that VDS 120 and an address of a storage location if applicable. The list VDSs function may be callable to list the VDSs 120 that are managed by VDSM 130 and information about those VDSs 120, such as their VDS metadata 230, in some cases. The backup VDS function may be callable to create a backup VDS 120 of a specified VDS 120— the backup VDS 120 may be stored away. The clone VDS function may be callable to clone a specified VDS 120. The query VDS function may be callable to issue a query against one or more VDSs 120—this function can be implemented by query engine 314 as discussed below.

User interface engine 312, in various embodiments, provides user interfaces that serve as a frontend to VDSM API 311. These user interfaces may enable a user to select from various options (e.g., via dropdown menus) to configure their VDS environment. As an example, user interface engine 312 may send user interface information to a computer system of the user and that computer system may then present a user interface for creating/adding a VDS 120 based on the user interface information. The user may select a data source 110 (e.g., from a dropdown menu that includes a list of data sources 110), a location at which to store data of the VDS 120 (e.g., selected from another dropdown menu), a data format corresponding to the selected data source 110, etc. The user may further select plugins 224 from a list of plugins 224 to be used in relation to the VDS 120 being created. The information that is provided by the user via the user interface may be passed to VDSM 130 via functions of VDSM API 311 (e.g., the create VDS function). In some embodiments, user interface engine 312 supports command line tools, such as the Python command line, as a way to interact with VDSM 130 and VDSs 120.

In addition to enabling a user or another entity to invoke the functionality of VDSs 120 and VDSM 130, user interfaces may present information obtained from VDSs 120 and VDSM 130. For example, if a query is issued to VDSs 120, the results of that query may be presented to a user via a user interface. As another example, a user may wish to see analytical information about their VDS environment. Accordingly, a user interface may display an amount of storage occupied by a set of VDSs 120, an average amount of time that a query takes to execute against the set of VDSs 120, etc.

Access control engine 313, in various embodiments, controls access to the functionality and data of VDSM 130 and its VDSs 120. In various embodiments, access control engine 313 maintains a list of users and approved actions that those users can perform. For example, access control engine 313 may include an access rule that indicates that user A can issue queries to a particular VDS 120 for data. That access rule may further indicate that user A can access only a subset of data of that particular VDS 120—e.g., user A can access data from columns 1-1000 of a bitmap index 210 included in the particular VDS 120. When a request is received at VDSM 130 via VDSM API 311, in various embodiments, access control engine 313 checks the request against the list of users and approved actions to determine whether to permit the request to be processed. If the request is attempting to access data or perform an action that is not approved, then access control engine 313 may reject the request; otherwise, the request may be processed by VDSM 130.

In various embodiments, VDSM 130 maintains a plugin repository that stores various plugins 224 that may be instantiated by VDSM 130 to perform operations in relation to VDSs 120. As mentioned previously, there are various types of plugins 224 that include, for example, ingest plugins 224, consumption plugins 224, consumption plugins 224, monitoring plugins 224, and security plugins 224. In various embodiments, VDSM 130 associates a VDS 120 with a set of plugins 224 to be used with that VDS 120—those plugins 224 might be identified by the user whose creates that VDS 120. As an example, VDSM 130 may present a plugin store to a user and the user may pick and choose plugins 224 from the store to be associated with their VDS 120. VDSM 130 may maintain information about how plugins 224 are being used and by what VDSs 120. Two given VDSs 120 may be associated with different sets of plugins 224. In some embodiments, access control engine 313 controls who can access plugins 224 and the particular plugins 224 that they can access.

Query engine 314, in various embodiments, facilitates the execution of queries against the VDSs 120 that are managed by VDSM 130. Query engine 314 may receive, from a user or another entity via a query function of VDSM API 311, a data request that specifies one or more queries to be executed against one or more VDSs 120. In some cases, the one or more queries may be from a query language (e.g., SQL) that is different than the query language understood by VDSs 120 (e.g., the Pilosa Query Language). Accordingly, query engine 314 may translate the one or more queries into the query language that is understood by VDSs 120. Query engine 314 may further determine which of the VDSs 120 that are managed by VDSM 130 are relevant to the one or more queries. In some embodiments, query engine 314 accesses information from VDS registry 320 that identifies the data that is stored at the individual VDSs 120. Based on the data being queried and the data stored at the individual VDSs 120, query engine 314 may determine one or more VDSs 120 that should receive the one or more queries. Query engine 314 may then route the queries to those VDSs 120.

When routing a query to a VDS 120 whose data representation 210 has been sliced and distributed across multiple nodes 145, in various embodiments, query engine 314 selects one of the nodes 145 as a "representative" node that is responsible for distributing the query to the remaining nodes 145 and returning a collective result of the VDS 120. In some embodiments, nodes 145 elect one of the nodes 145 to be the representative node and present this election to query engine 314 so that query engine 314 can route the query. As such, the portion of a VDS 120 running on a given node 145 may include metadata that identifies the other nodes 145 that are running the same VDS 120 and software routines that are executable to route, based on that metadata, the query to the appropriate nodes 145. The representative node may receive results back from those nodes 145 and may compile those results into a collective result that is returned to query engine 314. In some embodiments, query engine 314 randomly selects the representative node from the nodes 145 that are implementing a particular VDS 120. In yet some embodiments, query engine 314 implements a selection scheme, such as a round robin scheme, or assesses the current workload of the corresponding nodes 145 and selects a node 145 that is not overloaded.

Resource manager 315, in various embodiments, allocates and deallocates resources in order to facilitate the operation of system 100, including VDSM 130 and VDSs 120. In various embodiments, resource manager 315 is supplied with a pool of resources that can be allocated to implement the various functionalities of VDSM 130 and VDSs 120. For example, the pool of resources might include 20 virtual machines that are available on nodes 145. Consequently, resource manager 315 may use one virtual machine to run an API server that provides VDSM API 311, another virtual machine to run a web server to implement user interface engine 312, several virtual machines to implement a set of VDSs 120, etc. As another example, the pool of resources may correspond to a cluster managed by an orchestration unit, such as Kubernetes™ or an AWS service. Accordingly, resource manager 315 may interface with the orchestration unit to implement the various functionalities of VDSM 130 and VDSs 120, which may involve providing the orchestration unit with configuration files (e.g., YAML files) that can be used to instantiate those entities.

In various embodiments, resource manager 315 can scale up or down the resources that are provided to a particular entity or service. As an example, when a VDS 120 is being created, resource manager 315 may initially scale up the resources (e.g., nodes 145) that are provided to implement the ingestion plugin 224 that is consuming data from the underlying data source 110. After a bulk of the data has been consumed, such that only changes to the data of the data source 110 need to be ingested for example, resource manager 315 may scale down/deallocate the resources provided for continuing the implementation of that ingestion plugin 224. As yet another example, if VDSM 130 is receiving a high volume of queries to be executed against a particular VDS 120, then resource manager 315 may scale up the resources (e.g., nodes 145) that are provided to implement that particular VDS 120. Resource manager 315 may then scale down the resources provided to that particular VDS 120 as the volume of queries decreases.

VDS registry 320, in various embodiments, stores information about the VDSs 120 that are managed by VDSM 130. This information may include the VDS metadata 230 from each of those VDSs 120—that is, VDS registry 320 may store a copy of the VDS metadata 230 of each VDS 120 managed by VDSM 130. As mentioned, query engine 314 may route queries to VDSs 120 that are identified based on information in VDS registry 320. In particular, in some cases, query engine 314 may access filter information 236 that is included in the VDS metadata 230 copies. As explained above, filter information 236 may identify a mapping between data fields of a VDS 120 and data fields of an underlying data source 110. As such, query engine 314 may determine which data fields are being accessed by a query and which VDSs 120 include those data fields based on filter information 236.

Figure 4A:
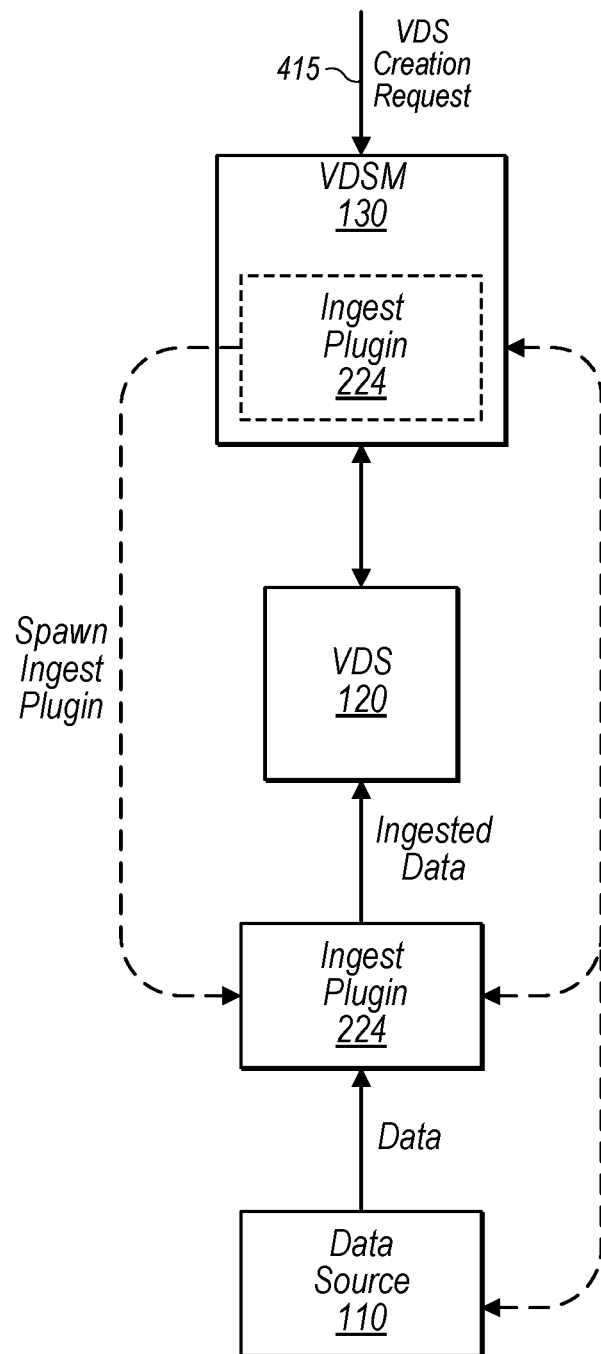
FIG. 4A is a block diagram illustrating example elements of an ingest plugin, according to some embodiments.

Turning now to FIG. 4A, a block diagram of an example ingest plugin 224 is shown. In the illustrated embodiment, VDSM 130 receives a VDS creation request 415—the request may be received from a user via VDSM API 311 or a user interface that is provided by user interface engine 312. VDS creation request 415, in various embodiments, is a request to create a VDS 120 from an origin (e.g., an underlying data source 110) or to load a previously created VDS 120 into compute cluster 140. Consequently, VDS creation request 415 may identify a location of the origin (e.g., a uniform resource location (URL)) and ingest information for selecting ingest plugin 224 from a list of ingest plugins and configuring ingest plugin 224 to ingest data from the origin. As an example, if data is being ingested from an Oracle® database, then an ingest plugin configured for Oracle® database may be selected from a list of plugins 224. That ingest plugin may be provided with the location of the underlying data source 110 (e.g., the URL), the VPN parameters if applicable, and the ingest information (e.g., source information 232, filter information 236, etc.).

To spawn ingest plugin 224, in various embodiments, resource manager 315 determines whether there are sufficient resources (e.g., servers) in the pool of resources to run ingest plugin 224. If there are sufficient resources, then resource manager 315 may allocate a set of resources for running ingest plugin 224, and ingest plugin 224 may be instantiated on those resources. If there are not sufficient resources, however, then resource manager 315 may wait to instantiate ingest plugin 224 until there are sufficient resources. As shown, ingest plugin 224 extracts data from data source 110 after being spawned by VDSM 130. When extracting data, ingest plugin 224 may extract data directly from the underlying data structure (e.g., a database table) or from a change data capture feed that identifies changes made to data source 110. Ingest plugin 224 may also look for changes to data in a data source 110 (e.g., a file system) and propagate those changes into VSD 120.

As depicted, ingest plugin 224 produces ingested data that is provided to VDS 120. In some cases, ingest plugin 224 transforms data from a first format to a second, different format that permits that data to be stored at VDS 120. Consider an example in which VDS 120 includes a bitmap index as a data representation 210 and that the underlying data is being extracted from a database table. Ingest plugin 224 may create a bit string having bits that have been set to represent values from records of the database table. The bit string may then be added to the bitmap index of VDS 120. Ingest plugin 224 may continually ingest updates to data in the data source 110 in order to keep VDS 120 updated.

In various cases, ingest plugin 224 may execute on the same network as the origin (e.g., an underlying data source 110), but that network may be a different network than the network associated with VDS 120. Consequently, ingest plugin 224 may abstract (e.g., convert the data into a bit stream/format) and compress the data that it ingests before sending that compressed ingested data to VDS 120—this may reduce the amount of network bandwidth consumed in transporting the data. In various embodiments, ingest plugin 224 can be stacked with other plugins 224 such that the output of ingest plugin 224 serves as the input of another plugin 224 (or vice versa). For example, an ingest transformation plugin 224 may convert user birthdates from a database table into age values and ingest plugin 224 may store those age values in a bit string format.

Figure 4B:
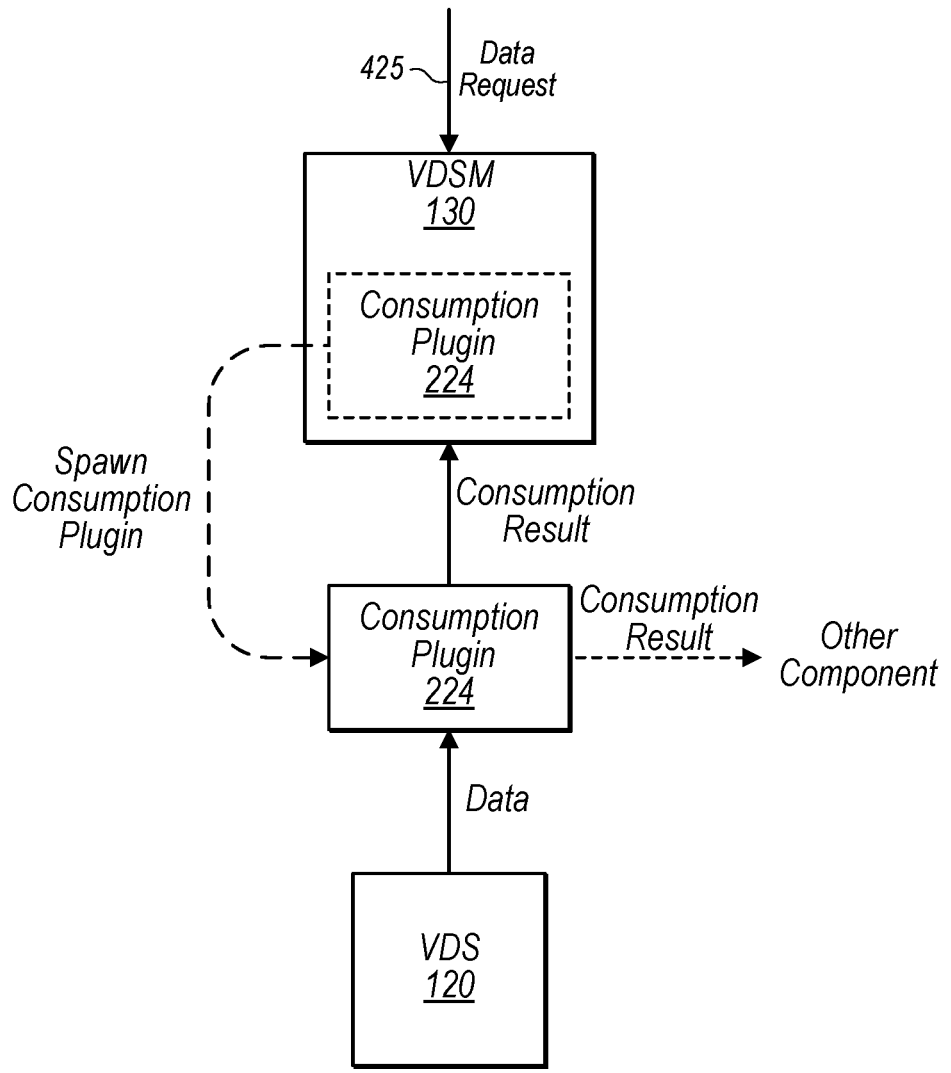
FIG. 4B is a block diagram illustrating example elements of a consumption plugin, according to some embodiments.

Turning now to FIG. 4B, a block diagram of an example consumption plugin 224 is shown. Consumption plugin 224, in various embodiments, is a set of software routines executable to perform operations on outgoing data from VDS 120. The illustrated embodiment presents an example use case of a consumption plugin 224 in which VDSM 130 receives a data request 425—the request may be received from an entity via VDSM API 311 or a user interface that is provided by user interface engine 312. Instead of spawning consumption plugin 224 in response to data request 425 as discussed below, VDSM 130 may spawn consumption plugin 224 in response to a trigger event or set intervals of time, for example.

Data request 425, in various embodiments, is a request for particular data from VDS 120. Data request 425 may specify one or more queries to execute against VDS 120 and may specify a data format in which to return the results from VDS 120 to the requestor. VDSM 130 may select, based on the format of the queries, a particular consumption plugin from a list of consumption plugins 224 that is capable of converting the one or more queries of data request 425 from, e.g., SQL into a query format understood by VDS 120 so that those queries can be executed. In some cases, consumption plugin 224 may translate API calls written for, e.g., Cassandra® or MongoDB® into a query format understood by the VDS 120 so that those calls can be carried out. VDSM 130 (or consumption plugin 224) may route the converted queries to VDS 120. In some cases, a consumption transformation plugin 224 may receive a query result from VDS 120 and convert the result into the requested data format before returning the formatted query result to VDSM 130. For example, if data is being written from VDS 120 into a relational database, then the consumption transformation plugin 224 may translate the data into the format of that relational database.

Another example of a consumption plugin 224 is a plugin that ensures that data leaving VDS 120 is compliant with specified policies. For example, VDS 120 might be deployed and executing within an EU country. As a result, a consumption plugin 224 may be instantiated that can verify that outgoing data is compliant with the General Data Protection Regulation. Another example of a consumption plugin 224 is a plugin that establishes a secure connection between the VDS environment and the destination computer system so that data is secure during transmission between VDS 120 and the destination computer system. Another example of a consumption plugin 224 is a plugin that replicates changes from one VDS 120 to another VDS 120. For example, a consumption plugin 224 may ensure that a Europe-based VDS 120 is kept up to date with a US-based counterpart VDS 120 by detecting changes to the US-based VDS 120 and propagating them to the Europe-based VDS 120.

Figure 4C:
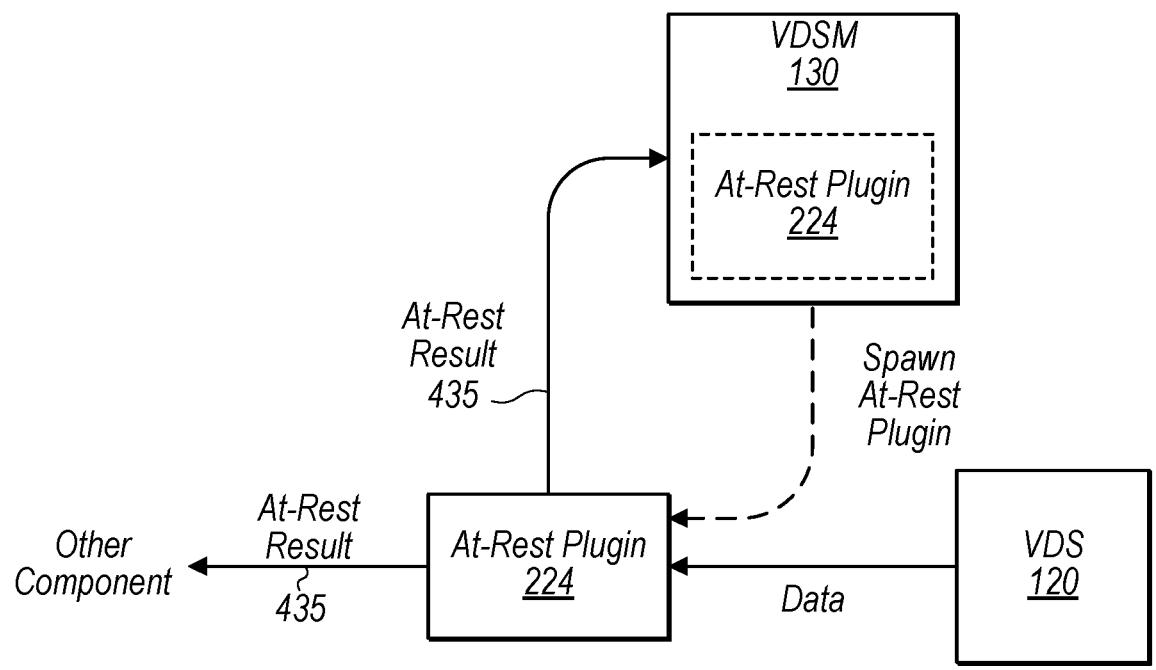
FIG. 4C is a block diagram illustrating example elements of an at-rest plugin, according to some embodiments.

Turning now to FIG. 4C, a block diagram of an example at-rest plugin 224 is shown. At-rest plugin 224, in various embodiments, is a set of software routines that are executable to perform a set of operations on data while it resides at VDS 120. In the illustrated embodiment, at-rest plugin 224 is spawned by VDSM 130. In various cases, VDSM 130 may spawn at-rest plugin 224 in response to receiving a request to perform a particular task (e.g., from a user that wants to run an analysis on the data of VDS 120); in yet other cases, VDSM 130 may spawn at-rest plugin 224 in response to a trigger event (e.g., an update to VDS 120) or at set intervals of time.

Examples of at-rest plugins 224 include a plugin that generates results from executing machine learning models based on data in VDS 120, a plugin that generates charts and graphs providing a visual representation of data in VDS 120 (e.g., a chart showing different income levels), a plugin that performs a data integrity operation in order to verify that data included in VDS 120 accurately represents data included in data source 110, etc. As shown, at-rest plugin 224 generates an at-rest result 435 that is derived from the operations that it performs on data from VDS 120. That at-rest result 435 can be sent to VDSM 130 or to another component (e.g., a user device). For example, if at-rest plugins 224 is a plugin that generates charts and graphs, then at-rest plugins 224 may send information about the charts and graphs to VDSM 130 as at-rest result 435 for generating a user interface to present the charts and graphs to a user. In some cases, at-rest result 435 may be inserted as new data into VDS 120 or used to update data already stored in VDS 120. An at-rest transformation plugin 224 may be used to transform at-rest result 435 to a particular format before it is stored in VDS 120. At-rest plugins 224 may further be used, for example, for feature engineering, calculating fields, etc.

Figure 5A:
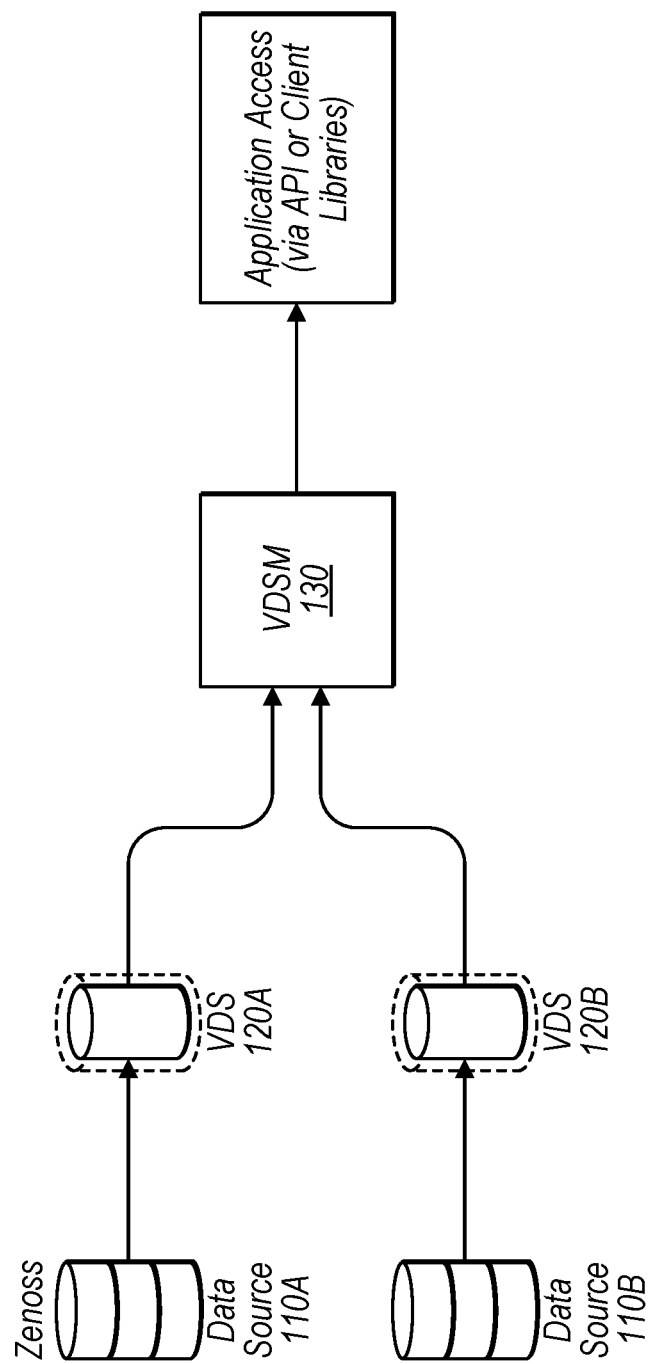
FIG. 5A is a block diagram illustrating an example implementation involving a VDSM and VDSs, according to some embodiments.

Turning now to FIG. 5A, a block diagram of an example implementation of VDSM 130 and VDSs 120 is shown. In the illustrated embodiment, the example implementation includes multiple VDSs 120 that are managed by VDSM 130. As shown, data source 110A, which is a platform provided by Zenoss®, is an origin of data for VDS 120A, and data source 110B, which may be a data lake, is an origin of data for VDS 120B. VDSM 130 may receive queries from applications (via APIs or client libraries) for data stored at the original data sources 110. Instead of executing the queries against data source 110A and 110B, VDSM 130 may execute the queries against VDSs 120A and 120B. Accordingly, VDSM 130 may receive a result from VDSs 120A and 120B and return that result to the requesting process. In various cases, due to the structural nature of VDSs, executing the queries against VDSs 120A and 120B can be performed in a shorter amount of time relative to executing the queries against data sources 110A and 110B.

Figure 5B:
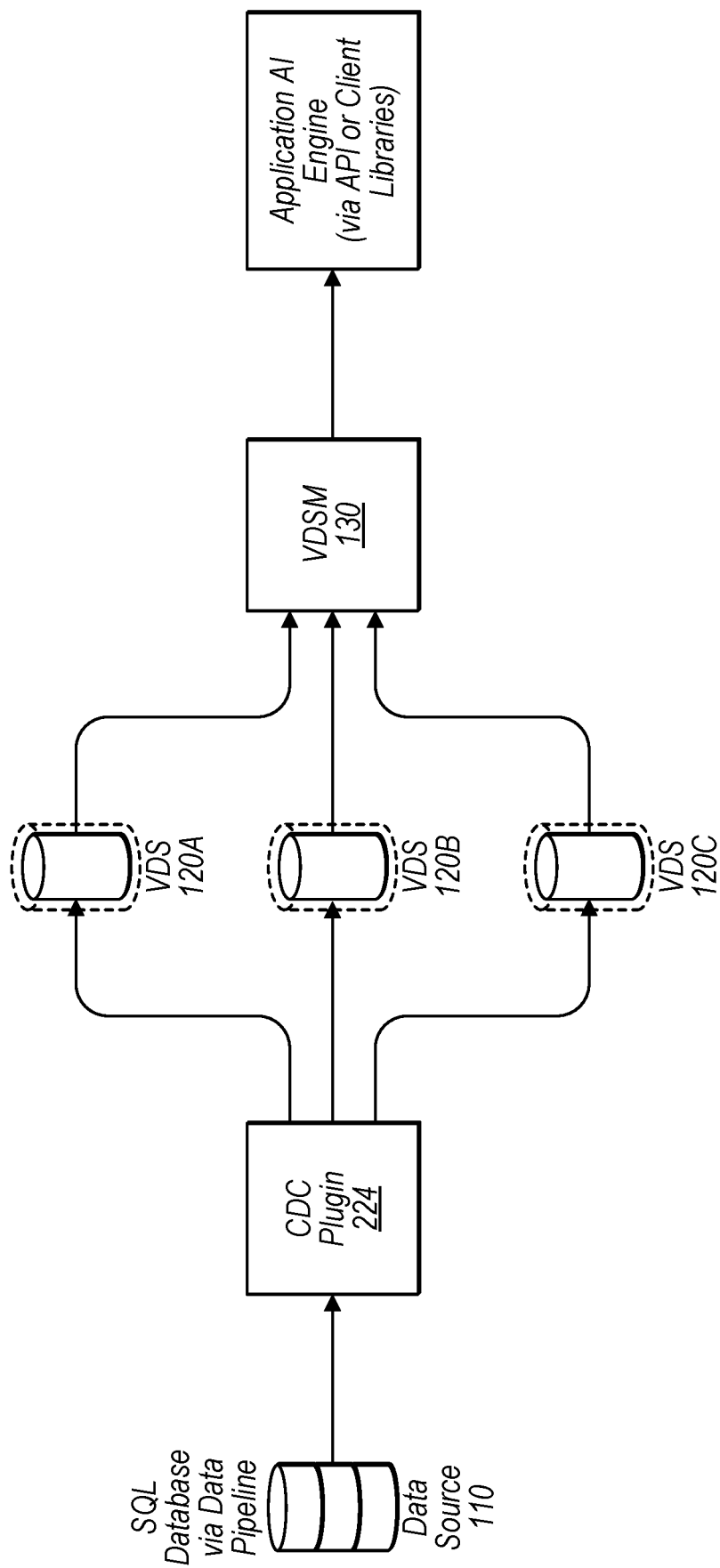
FIG. 5B is a block diagram illustrating another example implementation involving a VDSM and VDSs, according to some embodiments.

Turning now to FIG. 5B, a block diagram of another example implementation of VDSM 130 and VDSs 120 is shown. In the illustrated embodiment, VDSs 120A-C include data that is representative of data stored at data source 110, which is a SQL database in the illustrated embodiment. As shown, there is a change data capture (CDC) plugin (an example of an ingest plugin 224) that can ingest data from data source 110 and into VDS 120A-C. This may include updates received at the SQL database as part of its ingest pipeline. As further shown, VDSM 130 interfaces with an application and/or an AI engine (which may be an example of a consumption plugin 224) that issues requests for data to VDSM 130. VDSM 130 can execute queries derived from those requests against VDSs 120A-C to generate a result. VDSM 130 may then return that result to the application and/or AI engine. When implementing AI routines, in various cases, VDSs 120A-C are more suitable for the operations being performed by those AI routines than the SQL database since VDSs 120A-C may support a higher speed of iteration and if the model is embedded, adjacency in the same compute fabric.

Figure 6:
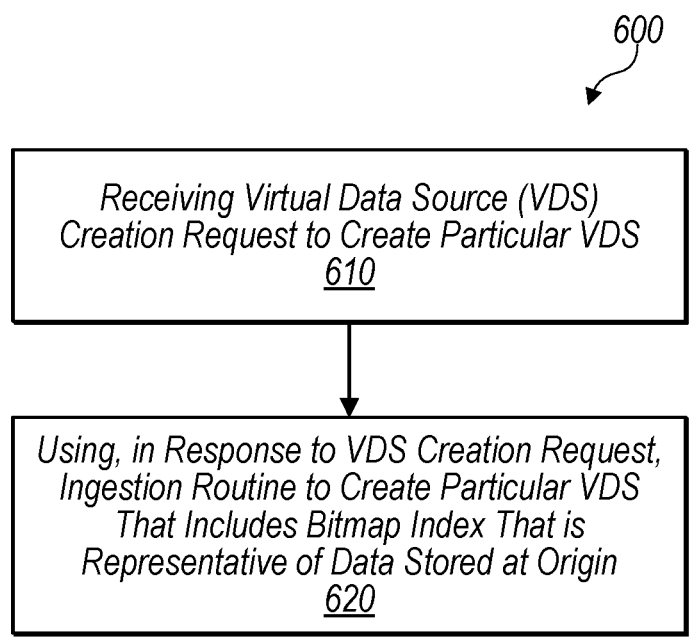
FIG. 6 is a flow diagram illustrating an example method relating to creating a VDS, according to some embodiments.

Turning now to FIG. 6, a flow diagram of a method 600 is shown. Method 600 is one embodiment of a method performed by a computer system implementing a virtual data source manager (e.g., a VDSM 130) that is capable of creating and managing virtual data sources (e.g., VDSs 120). In some cases, method 600 may be performed by executing a set of program instructions stored on a non-transitory computer-readable medium. In some embodiments, method 600 includes more or less steps than shown. For example, method 600 may include a step in which the VDSM processes a request for data included in a VDS.

Method 600 begins in step 610 with the VDSM receiving a virtual data source (VDS) creation request (e.g., a VDS creation request 415) to create a particular VDS. The VDS creation request may include information (e.g., VDS metadata 230) that is usable to identify an origin of the particular VDS and an ingestion routine (e.g., an ingest plugin 224). The information included in the VDS creation request may identify a set of data filters usable to select a subset of the data stored at the origin of the particular VDS—e.g., select data from fields "income," "name," and "hobbies" of database table "user". Accordingly, at least one of the data filters may specify a mapping from a data field of the origin of the particular VDS to a data field of the particular VDS. In some cases, a first field name may be used for the data field of the origin of the particular VDS and a second, different field name is used for the data field of the particular VDS. The information included in the VDS creation request may identify a set of data transformation usable for transforming data of the origin from a first value (e.g., a birthdate) to a second value (e.g., an age).

In step 620, in response to the VDS creation request, the VDSM uses the ingestion routine to create the particular VDS that includes a bitmap index (e.g., a data representation 210) that is representative of data stored at the origin. In response to a data request (e.g., a data request 425) that corresponds to the origin, in various embodiments, the particular VDS is usable to initiate a query to the particular VDS without accessing the origin. In some cases, the origin may be an original data source corresponding to a relational database or a non-relational database. In yet some cases, the origin is a second VDS created based on data stored at a corresponding original data source—e.g., topology 150B.

In various cases, the VDSM may receive a particular data request for data stored in a set of original data sources that correspond to a set of VDSs managed by the VDSM. The set of VDSs includes the particular VDS. Based on the particular data request, the VDSM may determine that the bitmap index included in the particular VDS corresponds to the particular data request. For example, the particular data request may request access to data from a "user" database table stored at the origin and the bitmap index included in the particular VDS may store information representative of the data stored in that "user" database table. Accordingly, the VDSM may determine that the bitmap index can be used to process the data request. The VDSM may send, to the particular VDS, one or more queries that are based on the particular data request (e.g., the data request may specify the queries) to access the requested data without accessing the origin of the particular VDS.

In some embodiments, the VDSM causes a user interface to be displayed to a user via a user device. The user interface may permit the user to invoke functions included in an API (e.g., VDSM API 311) by selecting one or more options displayed in the user interface. The one or more options may include an option to select a origin from a list of origins (e.g., data sources 110 and VDSs 120) upon which to create a VDS. Accordingly, the information that is included in VDS creation request may identify a selection by the user of the origin of the particular VDS from the list of origins. The one or more options may also include an option to select a set of software plugins from a library of software plugins (e.g., plugins 224) maintained by the VDSM. A given software plugin from the library may be executable to perform a respective set of functions (e.g., data transformation) in relation to the particular VDS. In some cases, the particular VDS may be associated with a first set of software plugins that is different than a second set of software plugins that is associated with a second particular VDS managed by the VDSM.

In some embodiments, the VDSM manages a pool of resources by allocating resources (e.g., servers, nodes 145, storage devices, etc.) of the pool to the VDS and one or more services (e.g., VDSM API 311, user interface engine 312, etc.) maintained by the computer system. The VDSM may provide an application programming interface (API) (e.g., VDSM API 311) that permits an external entity (e.g., an application server) to issue requests to the VDSM to perform one or more functions (e.g., access data) in relation to the VDS. The API may include a delete function callable to cause the VDSM to delete a VDS, a list function callable to cause the VDSM to list VDSs managed by the VDSM, and/or a clone function callable to cause the VDSM to create a VDS by cloning another VDS. The VDSM may allocate at least one resource (e.g., a server) from the pool as an API server for implementing the API. In various cases, the VDSM may allocate at least one resource (e.g., a server) from the pool to a compute cluster for implementing the VDS—the compute cluster may implement a plurality of VDSs managed by the VDSM. In some cases, the VDSs may be implemented on a set of virtual machines and the VDSM may be implemented on a different virtual machine. In various cases, the VDSM may allocate at least one resource (e.g., a server) from the pool as a web server for providing user interfaces from a user interface engine of the VDSM. In various cases, the VDSM may allocate at least one resource (e.g., a server) from the pool as an ingest server for implementing the ingestion routine to create the particular VDS.

Figure 7:
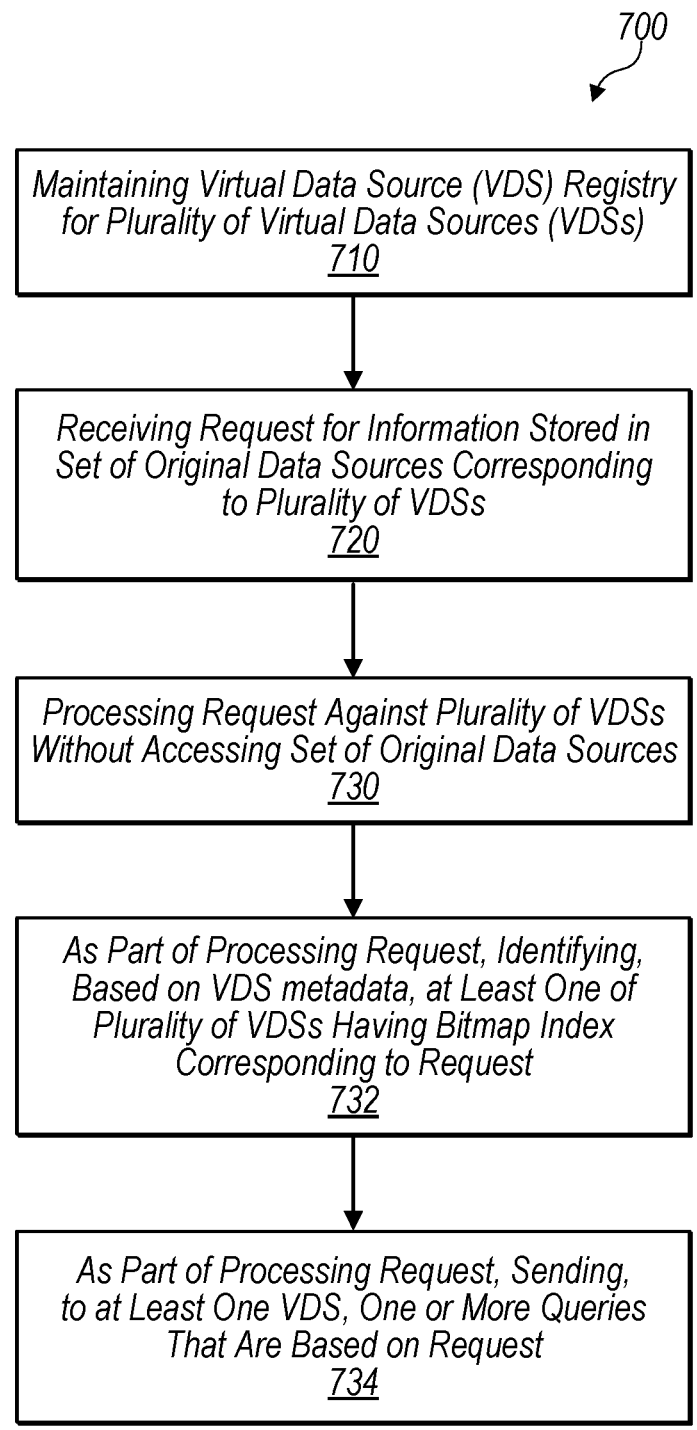
FIG. 7 is a flow diagram illustrating an example method relating to using a VDS to process a data request, according to some embodiments.

Turning now to FIG. 7, a flow diagram of a method 700 is shown. Method 700 is one embodiment of a method performed by a computer system implementing a virtual data source manager (e.g., a VDSM 130) that is capable of using virtual data sources (e.g., VDSs 120) to process data requests (e.g., data requests 425). Method 700 may be performed by executing a set of program instructions stored on a non-transitory computer-readable medium. In some embodiments, method 700 includes more or less steps than shown. For example, method 700 may include a step in which the VDSM creates a VDS.

Method 700 begins in step 710 with the VDSM maintaining a virtual data source (VDS) registry (e.g., a VDS registry 320) for a plurality of virtual data sources (VDSs). The VDS registry may include, for a given one of the plurality of VDSs, VDS metadata (e.g., VDS metadata 230) that is indicative of data represented in a bitmap index (e.g., a data representation 210) included in that given VDS. In step 720, the VDSM receives a request for information (e.g., data request 425) stored in a set of original data sources (e.g., data sources 110) that correspond to the plurality of VDSs.

In step 730, the VDSM processes the request against the plurality of VDSs without accessing the set of original data sources. In step 732, as part of the processing, the VDSM identifies, based on the VDS metadata, at least one of the plurality of VDSs having a bitmap index corresponding to the request (e.g., the VDS metadata indicates that its corresponding bitmap index stores information for a data field from which data is being requested). In step 734, as part of the processing, the VDSM sends, to the at least one VDS, one or more queries that are based on the request. Prior to sending the one or more queries, the VDSM may cause execution of a consumption routine (e.g., a plugin 224) to convert the one or more queries from a first format corresponding to the set of original data sources to a second, different format corresponding to the at least one VDS. In some cases, the VDSM may determine, whether an issuer of the request for information is included in a list of issuers permitted to access information from the at least one VDS. In some cases, the VDSM may aggregate information returned by at least two different VDSs for the one or more queries to generate a result and return the result to the issuer of the request for information.

In various cases, the VDSM may receive a VDS creation request to create a particular VDS. The VDSM may use, in response to the VDS creation request, an ingestion routine to create the particular VDS to include a bitmap index that is representative of data stored at an origin. The VDSM may update the VDS registry to include VDS metadata for that particular VDS.

Figure 8:
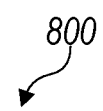
FIG. 8 is a flow diagram illustrating an example method relating to creating a VDS, according to some embodiments.

Turning now to FIG. 8, a flow diagram of a method 800 is shown. Method 800 is one embodiment of a method performed by a computer system to create a VDS (e.g., a VDS 120). Method 800 may be performed by executing a set of program instructions stored on a non-transitory computer-readable medium. In some embodiments, method 800 may include more or less steps than shown. For example, method 800 may include a step in which the created VDS is used to process a data request (e.g., a data request 425).

Method 800 begins in step 810 with the computer system creating a virtual data source (VDS) based on a corresponding origin (e.g., a data source 110). The VDS may include a bitmap index (e.g., a data representation 210) that is representative of data stored at the origin and ingestion metadata (e.g., VDS metadata 230) that specifies a location of the origin and a set of ingest parameters for configuring an ingestion routine (e.g., an ingest plugin 224) to ingest data from the origin into the bitmap index.

In some cases, the origin may be an original data source that corresponds to a storage service of a cloud-based platform on a wide area network. The location may correspond to one or more files maintained by the storage service. Accordingly, the set of ingest parameters may specify: access credentials that permit the ingestion routine to access the one or more files; and at least one data format (e.g., JSON) of data objects included in the one or more files to enable the ingestion routine to parse ones of the data objects. In yet some cases, the origin may be an original data source that corresponds to a pipeline of a pipeline-based platform (e.g., Kafka® platform) that provides a data stream. As such, the set of ingest parameters may specify: a host address corresponding to the pipeline-based platform; a pipeline identifier that indicates the pipeline; and at least one data format of a set of data objects in the pipeline that enables the ingestion routine to parse ones of the set of data objects.

In some cases, the set of ingest parameters may specify a storage location at which to store data ingested from the origin for inclusion in the bitmap index. The storage location may corresponds to a data store of a storage service that is provided by a cloud-based platform on a wide area network. In various cases, the computer system may store data ingested from the origin for inclusion in the bitmap index at a data store that is included in a compute cluster (e.g., compute cluster 140) that implements the VDS. The compute cluster may be managed by the computer system (e.g., managed by VDSM 130 executing on the computer system). The set of ingest parameters may specify: a mapping of a set of data fields of one or more data objects of the origin to a set of data fields of the bitmap index of the VDS. The set of data fields of the one or more data objects that is defined in the mapping is a subset of all data fields of the one or more data objects—e.g., the one or more data objects may include four data fields but only two are mapped to the bitmap index. The one or more data objects may include at least one database table. The VDS may be created such that the VDS includes an access list that identifies sets of entities and respective sets of data that can be accessed from the bitmap index by ones of those sets of entities.

The VDS may be associated with a VDS identifier that enables the computer system to identify the VDS separately from other VDSs that are managed by the computer system. In some cases, the VDS may include fingerprint information (e.g., fingerprint information 235) indicative of the VDS and the fingerprint information may specify a number of rows of the bitmap index, a number of columns of the bitmap index, and a data density of the bitmap index.

Figure 9:
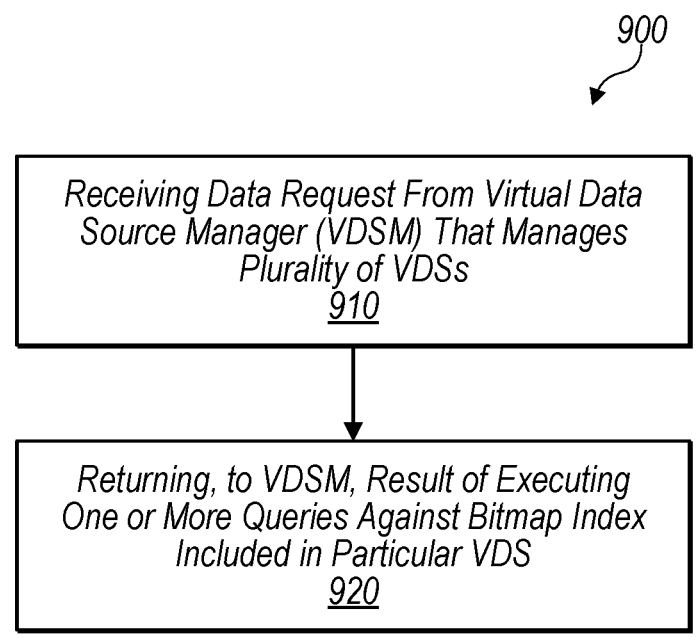
FIG. 9 is a flow diagram illustrating an example method relating to a VDS processing a data request, according to some embodiments.

Turning now to FIG. 9, a flow diagram of a method 900 is shown. Method 900 is one embodiment of a method performed by a VDS (e.g., a VDS 120) executing on a computer system to process a data request (e.g., a data request 425). Method 900 may be performed by executing a set of program instructions stored on a non-transitory computer-readable medium. In some embodiments, method 900 may include more or less steps than shown. For example, method 900 may include a step in which the VDS is created.

Method 900 begins in step 910 with the VDS receiving a data request from a virtual data source manager (VDSM) (e.g., VDSM 130) that manages a plurality of VDSs. The data request may identify one or more queries to be executed against a bitmap index (e.g., a data representation 210) that is representative of data stored in an origin (e.g., a data source 110) of the VDS. The VDS may include a plurality of portions distributed across nodes of a compute cluster (e.g., VDS 120A distributed across nodes 145A-C). In various embodiments, the data request is received by a particular portion of the plurality of portions that is executing on a node of the compute cluster (e.g., the portion of VDS 120A executing on node 145A). The particular portion of the VDS may determine ones of the nodes that are executing other ones of the plurality of portions of the VDS (e.g., nodes 145B and 145C). The particular portion may route the one or more queries to those nodes determined to be executing the other portions of the VDS. The VDS may include ingestion metadata (e.g., VDS metadata 230) that specifies a location of the origin and a set of ingest parameters for configuring an ingestion routine to ingest data from the origin into the bitmap index. The origin may be a second VDS created based on a corresponding original data source.

In step 920, the VDS returns, to the VDSM, a result of executing the one or more queries against the bitmap index included in the VDS. In some cases, the particular portion of the VDS may receive a set of query results from the other portions of the VDS and may aggregate the set of query results into the result returned to the VDSM.

Figure 10:
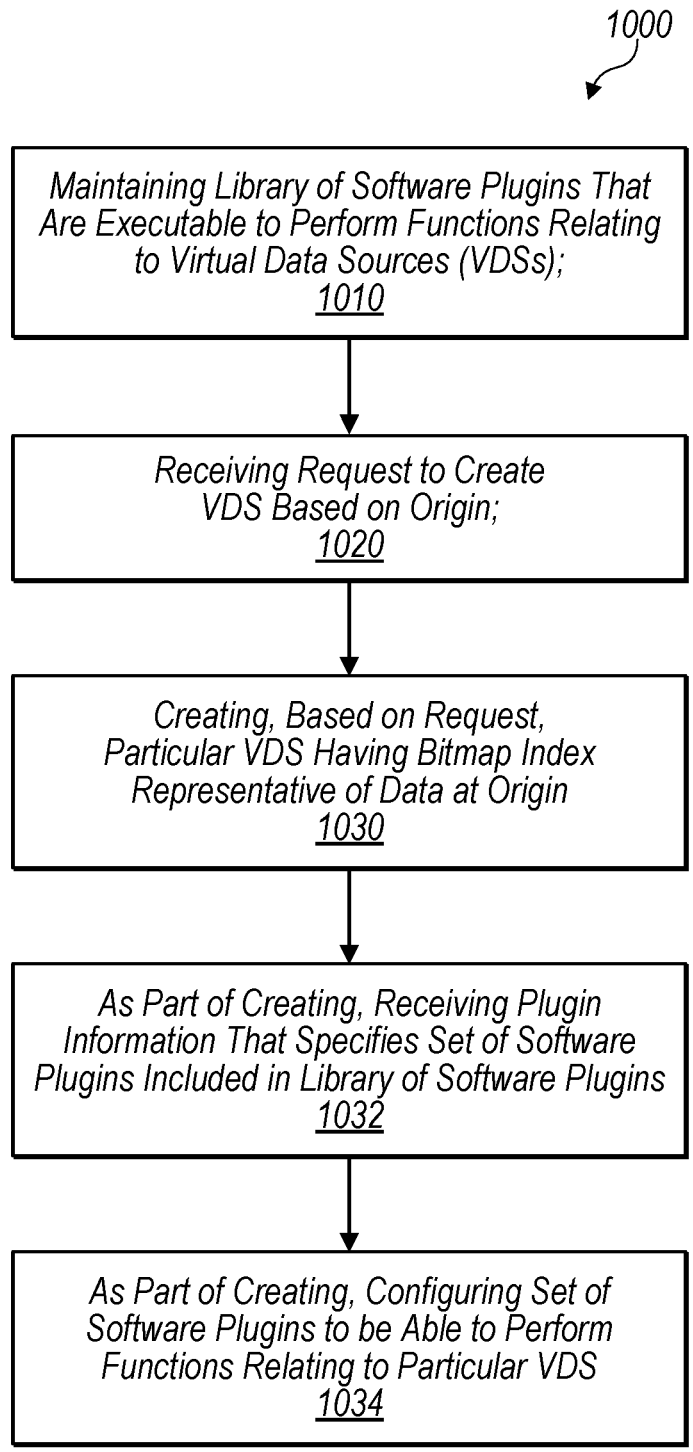
FIG. 10 is a flow diagram illustrating an example method relating to creating a VDS in association with software plugins, according to some embodiments.

Turning now to FIG. 10, a flow diagram of a method 1000 is shown. Method 1000 is one embodiment of a method performed by a VDSM (e.g., a VDSM 130) that is executing on a computer system to create a VDS (e.g., a VDS 120) with plugin support. Method 1000 may be performed by executing a set of program instructions stored on a non-transitory computer-readable medium. In some embodiments, method 1000 may include more or less steps than shown. For example, method 1000 may include a step in which the VDS used to process a data request (e.g., a data request 425).

Method 1000 begins in step 1010 with the VDSM maintaining a library of software plugins (e.g., plugins 224) that are executable to perform functions (e.g., ingest data from a data source 110 into a data representation 210 included in a VDS 120) relating to virtual data sources (VDSs). In step 1020, the VDSM receives a request (e.g., a VDS creation request 415) to create a VDS based on an origin (e.g., a data source 110).

In step 1030, the VDSM creates, based on the request, a particular VDS having a bitmap index (e.g., a data representation 210) representative of data at the origin. In step 1032, as part of the creating, the VDSM receives plugin information that specifies a set of software plugins included in the library of software plugins. In some cases, the VDSM may cause an interface (e.g., an interface generated by user interface engine 312) to be displayed to a user via a user device. The interface may present software plugins from the library of software plugins and the user may select a set of the software plugins to be associated with the VDS, resulting in the VDSM receiving the plugin information. In step 1034, as part of the creating, the VDSM configures the set of software plugins to be able to perform functions relating to the particular VDS. Configuring a plugin may include, for example, allocating resources (e.g., processors and memory) to execute the plugin, instantiating the plugin using those resources, configuring network ports to permit the plugin to communicate with a VDS, and/or providing storage to the plugin for storing results from its execution.

In some cases, the VDSM may receive a request (e.g., a data request 425) for data included in the bitmap index. The request for data may specify one or more queries (e.g., SQL queries) in a first format. The VDSM may spawn a consumption software plugin from the set of software plugins to process the request for data, including by translating the one or more queries from the first format to a second, different format (e.g., a VDS query language) that can be processed against the bitmap index.

In some embodiments, the set of software plugins include an ingest software plugin that is capable of accessing data of the origin and converting that data from a first format (e.g., data records of a database table) used at the origin to a second, different format (e.g., bit strings for a bitmap index) that permits that data to be stored in the bitmap index. The ingest software plugin may be capable of accessing data of the origin by ingesting data from a change data capture feed that identifies data changes to the origin. In some cases, the ingest software plugin may be capable of accessing data of the origin by identifying data changes in a file system of the origin and propagating the data changes into the bitmap index. The set of software plugins may include a second ingest software plugin that is capable of ingesting ingested data into the bitmap index that is produced by the first ingest software plugin—plugins 224 may be stacked such that the output of one plugin 224 is the input of another plugin 224. In some cases, the origin is located externally to the particular VDS (e.g., the origin is a cloud platform operated by a third party). The VDSM may cause the ingest software plugin to be executed on a computer system of a local-area network that includes the origin (e.g., executed on the cloud platform). The ingest software plugin may compress data ingested from the origin before sending that ingested data from the local-area network that includes the origin (e.g., the cloud platform) to a different local-area network that includes the particular VDS (e.g., another cloud platform). In some cases, the set of software plugins may include a transformation software plugin that is capable of performing a set of transformations on values of one or more data fields of the origin to generate values for a particular data field of the bitmap index that is not included in the data at the origin.

Figure 11:
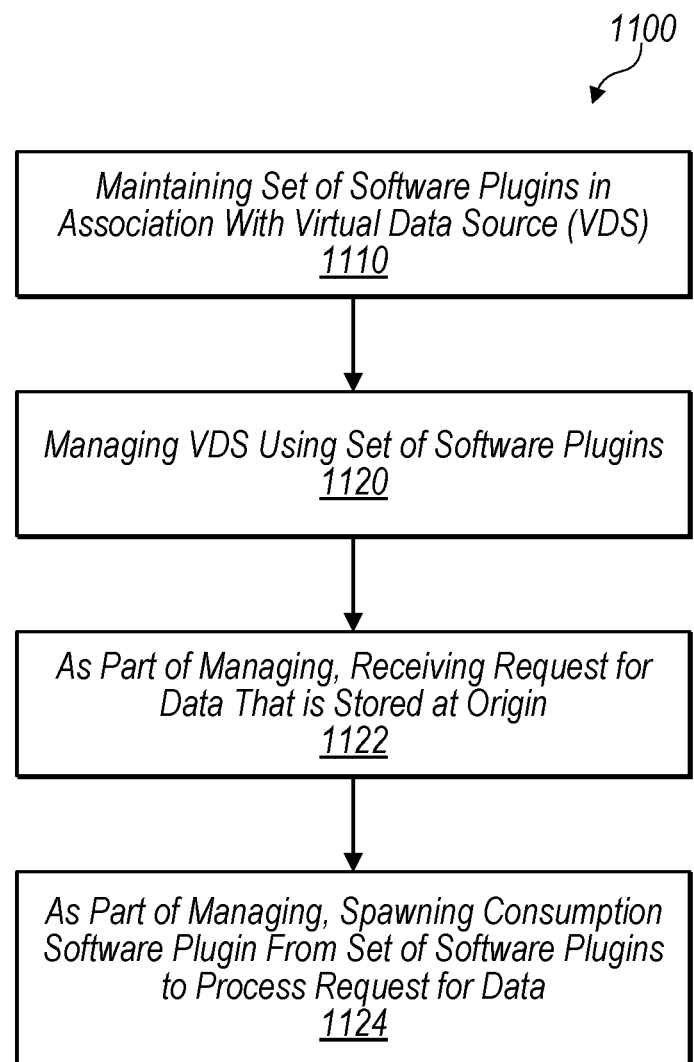
FIG. 11 is a flow diagram illustrating an example method relating to managing a VDS using software plugins, according to some embodiments.

Turning now to FIG. 11, a flow diagram of a method 1100 is shown. Method 1100 is one embodiment of a method performed by a VDSM (e.g., a VDSM 130) that is executing on a computer system to manage a VDS (e.g., a VDS 120) using a set of software plugins (e.g., plugins 224). Method 1100 may be performed by executing a set of program instructions stored on a non-transitory computer-readable medium. In some embodiments, method 1100 may include more or less steps than shown. For example, method 1100 may include a step in which the VDS used to process a data request (e.g., a data request 425).

Method 1100 begins in step 1110 with the VDSM maintaining a set of software plugins in association with a virtual data source (VDS). Ones of the set of software plugins may be executable to perform corresponding functions (e.g., access prevention, monitoring, data transformation, data encryption, etc.) in relation to the VDS. In some cases, a second VDS managed by the VDSM may be associated with a second set of software plugins that is different than the set of software plugins associated with the VDS. In some cases, the VDS may be created based on a second origin. The origin and the second origin may be different types of data sources. For example, the origin may be another VDS and the second origin may be an original data source that corresponds to a relational database.

In step 1120, the VDSM manages the VDS using the set of software plugins. In step 1122, as part of the managing, the VDSM receives a request (e.g., a data request 425) for data that is stored at an origin (e.g., a data source 110). The VDS may include a bitmap index (e.g., a data representation 210) representative of the data stored at the origin. In step 1124, as part of the managing, the VDSM spawns a consumption software plugin from the set of software plugins to process the request for data. The consumption software plugin may translate one or more queries included in the request from a first format to a second, different format that can be processed against the bitmap index of the VDS.

In some cases, the set of software plugins may include a second consumption software plugin that may perform a data integrity operation to verify that data included in the bitmap index is representative of data included in the origin. In some cases, the set of software plugins may include a second consumption software plugin that is capable of executing one or more machine learning models against data included in the bitmap index. In some cases, the set of software plugins may include a security software plugin that is capable of establishing a secure connection for sending data from the VDS to an endpoint system. In some cases, the set of software plugins may include a security software plugin that is capable of preventing accesses of data included in the bitmap index are not compliant with a specified set of security policies. In some cases, the set of software plugins may include a monitoring software plugin that is capable of collecting a set of metrics pertaining to an operation of the VDS. In some cases, the set of software plugins may include a consumption software plugin that is capable of operating on data being sent from the VDS to a destination entity. The destination entity may be another particular VDS that is located in a different geographic region than the particular VDS. The consumption software plugin may be capable of detecting changes to the VDS and propagating the changes to the other VDS.

Exemplary Roaring B-Tree Format

As discussed above, one approach to reducing information size and the amount of time needed to process certain requests for information is to store that information in a set of bitmap indexes. Such bitmap indexes may allow for certain types of tasks (e.g., analytical tasks) to be performed more efficiently against the underlying information by utilizing hardware-efficient bitwise operations, which in turn may improve the performance of the overall system. In some implementations, the data of a bitmap index is stored using a set of memory-mapped files that each store the data of a sharded portion of the bitmap index. In those implementations, when new changes are made to the data, the changes are appended (e.g., in the form of representative operations) to the end of the memory-mapped file whose data is being changed. Those changes are cached in memory and processed to provide an updated view of the bitmap index.

Issues arise, however, when the system has to handle a large volume of changes to a bitmap index as increasing amounts of information have to be cached in the memory that eventually exceed the memory capacity of the system. Periodically, a compaction procedure is performed to recreate a memory-mapped file such that the old data in the file is removed. There are various problems with storing the data of bitmap indexes in this way. For example, the compaction procedure often requires large amounts of computer processing resources and input/output (I/O) operations. Additionally, in those implementations, rows of the bitmap index that are changed are rebuilt using a row cache that is implemented in heap memory; the row cache, however, has a high rate of lock contention when multiple threads are accessing the row cache simultaneously. Furthermore, a query directed to the bitmap index has no transactional guarantees as the data may change during execution of the query in a manner that is not readily apparent to the query's executioner.

In order to address the database operational concerns relating to bitmap index storage as discussed above, the disclosed techniques provide mechanisms for storing bitmap index data using binary trees (referred to as "b-trees"). In various embodiments described below, bitmap index data is compressed using Roaring compression and then is stored within pages (e.g., 8 KB storage units/structures) that form b-trees. Particularly, shards of a bitmap index (a shard may include multiple rows of a bitmap index) may be compressed using Roaring compression techniques to generate multiple containers. Each container may store information identifying bit positions in the shard that have been set (e.g., to a bit value "1"). In various embodiments, the containers are stored in pages that correspond to the leaf nodes of b-trees and are accessible by traversing the b-trees using look-up keys associated with the bit positions being assessed.

In various embodiments, the pages having the data of a shard that has been compressed using Roaring compression techniques are stored in a data file. This file may include multiple b-trees for the multiple fragments that make up the shard. A fragment is a field (e.g., a set of rows) of a shard of a bitmap index and, therefore may be referred to as a field shard of a bitmap index. As an example, "city" may be a field having multiple rows that correspond to different cities (e.g., Austin, New York City, etc.) and an associated fragment would include the portion of those rows that is within a shard. Since a shard may include multiple fragments for the same bitmap index, a shard can be made up of multiple fields of the bitmap index. In some cases, a shard might include all the rows of a bitmap index, but only a subset of the columns of that index. In various embodiments, the data file is divided into equal 8 Kilobyte (KB) pages that store data for various nodes of b-trees included in this file. The pages of a data file may include one or more of the following: a metadata page (which includes header information), a branch page (which includes pointers to lower branches and leaf pages of a given b-tree), a leaf page (which includes a container), a bitmap page (which includes bitmap container data), and a root records page (which includes a list of all b-tree names and page numbers included in the data file). Any time updates are to be made to particular pages of a data file, in some embodiments, the updates are written to a write-ahead log as a set of new pages that overwrite/supersede the particular pages of the data file. Future accesses to those particular pages of the data file may consult a mapping to determine that they should access the new, updated pages and not those particular pages. Those new pages included in the write-ahead log may be periodically written into the data file to replace the particular pages.

The disclosed compression storage techniques may advantageously remove the need to perform compactions due to bitmap index updates being performed in-place. As changes are made to data files, the new pages generated based on the changes are written to the write-ahead log for ease of access and a mapping is provided that facilitates use of the new pages over the corresponding ones in the data files. As a result, the disclosed techniques allow for changes to data files to be performed by updating individual pages of these files without having to rewrite an entire file. This can improve the efficiency of managing data that is stored in virtual data sources. Additionally, a row cache is not needed as rows of the b-tree formatted bitmap indexes may be read directly from the data files. Further, lock contention may be reduced as locks on underlying data may be acquired only briefly at the start and end of database transactions. There may also be atomic, consistent, isolated, and durable (ACID) transaction guarantees.

Figure 12:
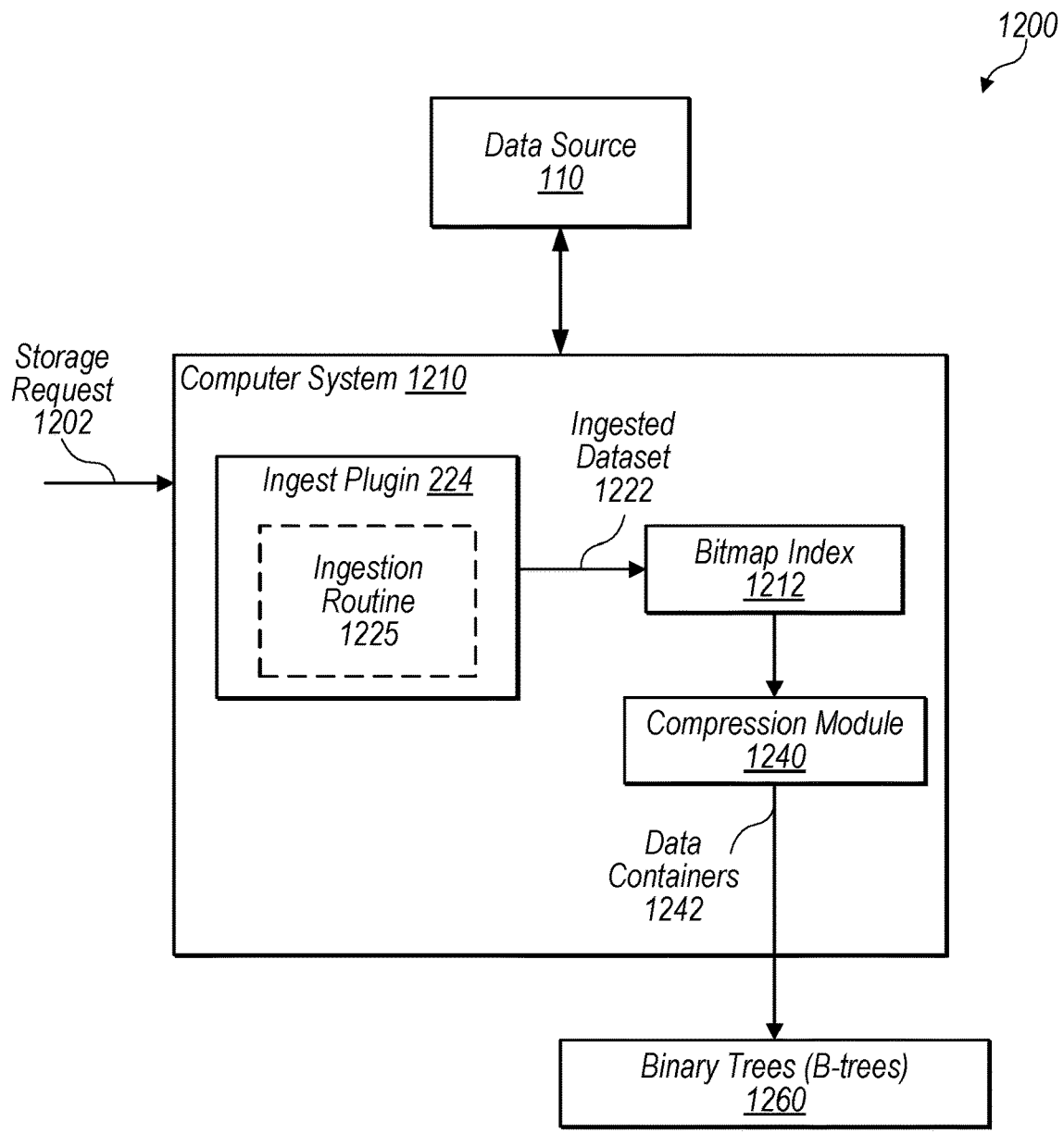
FIG. 12 is a block diagram illustrating an example system capable of generating a bitmap index from a dataset and storing the bitmap index's data using binary trees, according to some embodiments.

Turning now to FIG. 12, a block diagram of an example system capable of generating a bitmap index from a dataset and storing the bitmap index's data using binary trees is shown. In the illustrated embodiment, system 1200 includes data source 110, one or more b-trees 1260, and computer system 1210, which in turn includes ingest plugin 224, a bitmap index 1212 (a type of data representation 210), and compression module 1240.

Computer system 1210, in the illustrated embodiment, receives a storage request 1202. In some embodiments, this request specifies a particular dataset to be stored in a bitmap index 1212. This storage request may be received from devices of various entities such as businesses, individuals, etc. As an example, a desktop computer associated with a particular business may submit a request to store sales data. In some cases, storage request 1202 may be a VDS creation request 415 to create a VDS 120 (e.g., one with a bitmap index 1212 having the sales data). In some embodiments, request 1202 includes information specifying a dataset stored at an origin, such as data source 110, and a particular ingestion routine 1225. Computer system 1210 may access data source 110 to retrieve the requested dataset and then ingest this dataset using ingest plugin 224. For example, ingest plugin 224 may select a particular ingestion routine 1225 from a plurality of ingestion routines based on the information specified in request 1202.

Ingestion routine 1225, in the illustrated embodiment, produces an ingested dataset 1222 that is in the format of a bitmap index. That is, ingestion routine 1225 converts the dataset retrieved from data source 110 into a bitmap index format (e.g., an uncompressed bitmap index format). As shown for example, ingested dataset 1222 is used to construct bitmap index 1212. Information stored in bitmap index 1212 is representative of data stored at an origin (e.g., data source 110). An example bitmap index is discussed in more detail below with reference to FIG. 13A.

Compression module 1240, in the illustrated embodiment, compresses the ingested dataset 1222 stored in bitmap index 1212 to generate a plurality of data containers 1242. These data containers store respective compressed portions of the ingested dataset 1222. Example compression techniques are discussed below with reference to FIG. 14. Computer system 1210 then stores those data containers 1242 in one or more b-trees 1260—that is, they may be stored in pages that form one or more b-trees 1260. For example, each container 1242 may be stored in a node of a given b-tree. B-trees as discussed in more detail below with reference to FIG. 14. In some embodiments, computer system 1210 uses the set of b-trees to respond to various data requests corresponding to the origin to provide data without accessing the origin. For example, computer system 1210 may access b-trees 1260 to respond to requests for the ingested dataset 1222 instead of accessing data source 110.

In various embodiments, computer system 1210 is a compute cluster (e.g., compute cluster 140) having a set of compute nodes (e.g., nodes 145). The set of compute nodes may maintain virtual data sources (VDSs) 120 based on a corresponding set of origins. As discussed previously, VDSs 120 may include bitmap indexes (e.g., bitmap indexes 1212) representative of respective portions of datasets stored at the set of origins. In the disclosed techniques, these bitmap indexes may be compacted using Roaring compression to generate roaring bitmaps that are made up of various different roaring containers. Those roaring containers may be stored in pages of a data file that correspond to nodes of a set of b-trees. In some embodiments, when the compute cluster receives requests to update the data of these bitmap indexes, the cluster writes one or more new pages to a write-ahead log without having to rewrite the entirety of the file. This writing process overwrites the roaring containers stored in nodes of b-trees 1260, for example.

Figure 13A:
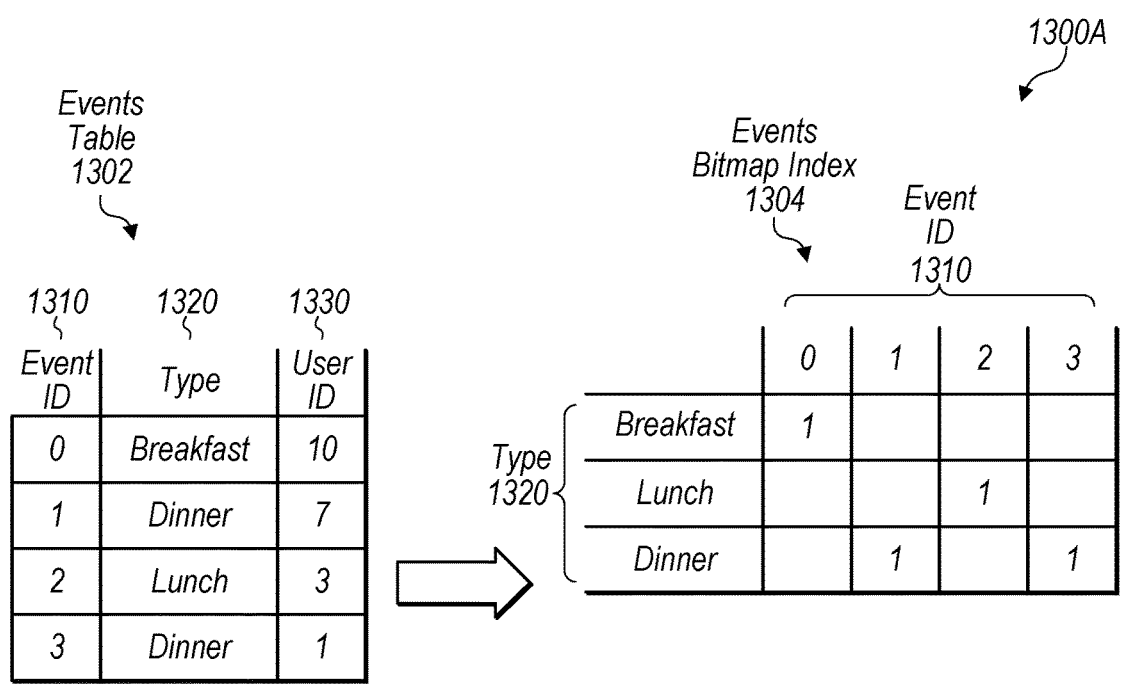
FIG. 13A is a block diagram illustrating examples of a dataset and a bitmap index, according to some embodiments.

Turning now to FIG. 13A, a block diagram illustrating examples of a dataset and a bitmap index 1304 is shown. In the illustrated embodiment, illustration 1300A shows an events table 1302 (an example dataset) and an events bitmap index 1304. Note that events bitmap index 1304 is one example of a bitmap index 1212 discussed above with reference to FIG. 12. Also as illustrated, events table 1302 includes the following columns: event identifier (ID) 1310, event type 1320, and user ID 1330. Table 1302 illustrates values for these columns for various different events. Each row of table 1302 represents a different event. For example, the first event in table 1302 is for an event of type "breakfast" which will be hosted by a user associated with user ID "10." This event has also been assigned an event ID of "0."

As shown in the illustrated example, events table 1302 is ingested according to an ingestion routine (as discussed above with reference to FIG. 12) to generate bitmap index 1304. Computer system 1210 may generate events bitmap index 1304 from the data that is stored in the event type 1320 and event ID 1310 fields of table 1302. Bitmap index 1304 is one example of a bitmap index that can be generated from the data that is stored in events table 1302. In the illustrated embodiment, three different rows are included in events bitmap index 1304 for the three different possible values of event type 1320 field: "breakfast," "lunch," and "dinner." Events bitmap index 1304 also includes columns/records for the different values of event ID 1310 of table 1302. In particular, the event of type "dinner" includes two high bits in bitmap index 1304 corresponding to event IDs 1 and 3. Similarly, bitmap index 1304 includes high bits for a breakfast event corresponding to event ID 0 and a lunch event corresponding to event ID 2.

Figure 13B:
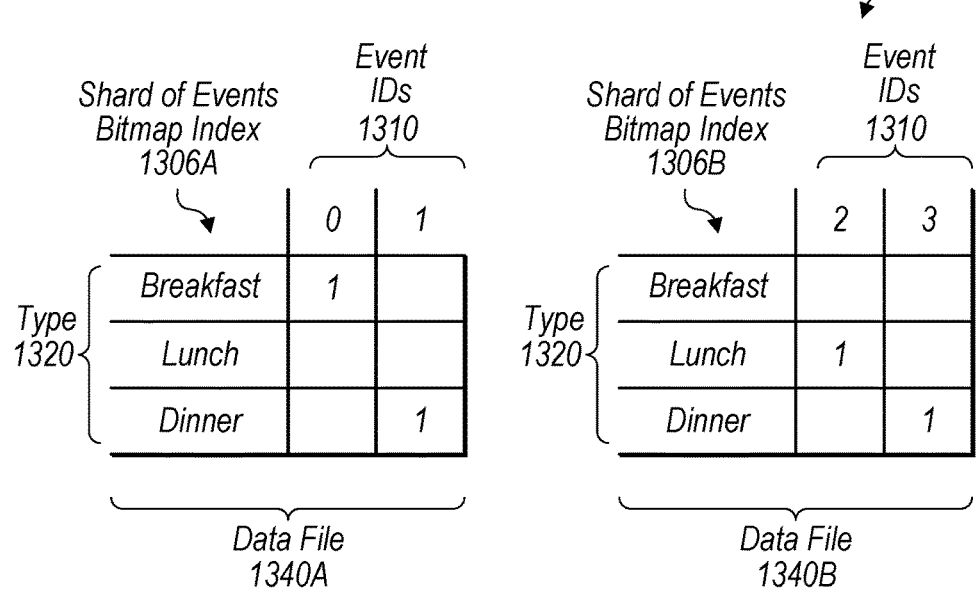
FIG. 13B is a block diagram illustrating example shards of a bitmap index, according to some embodiments.
Figure 13C:
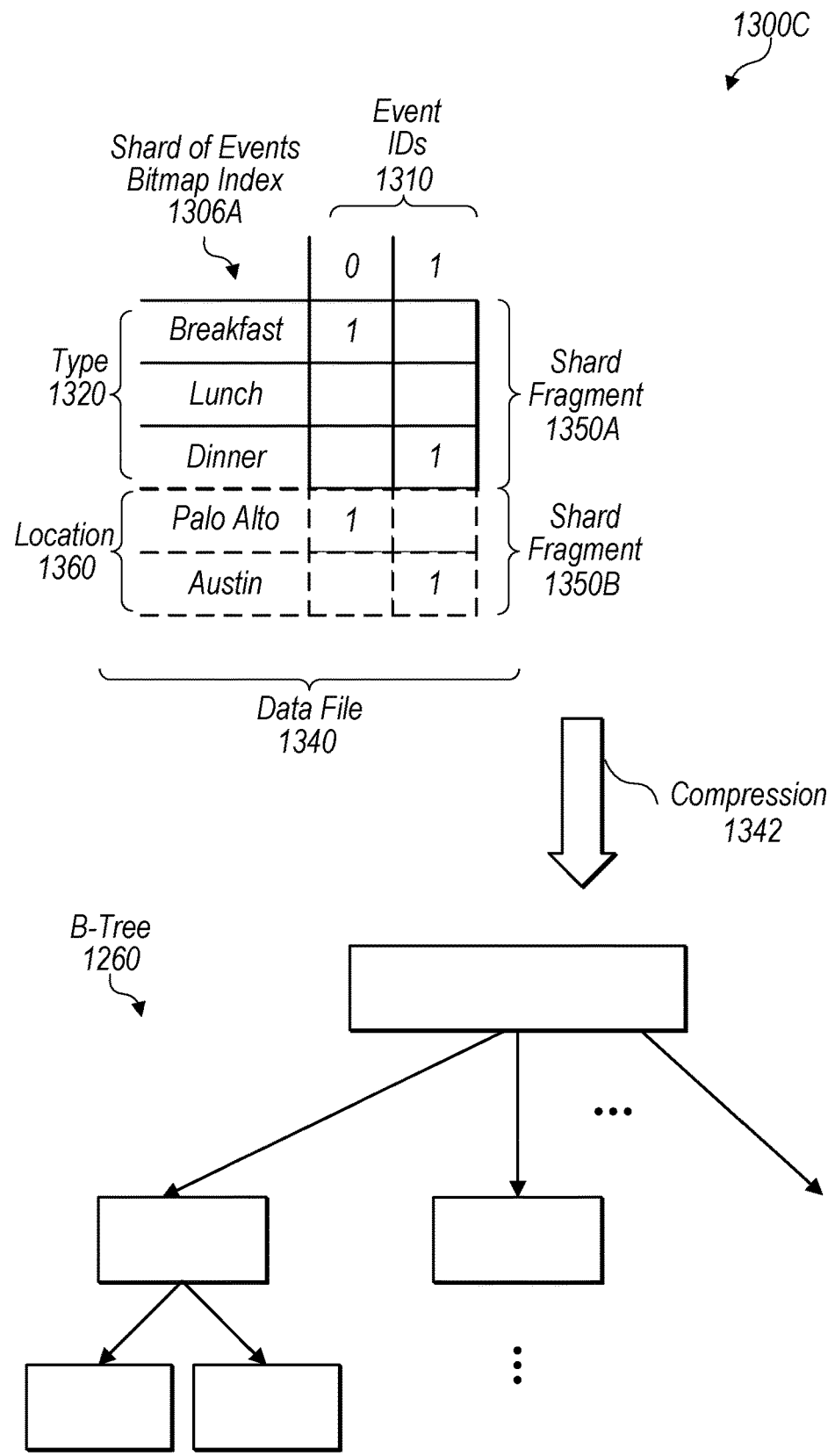
FIG. 13C is a block diagram illustrating example storage of a bitmap index shard in a binary tree, according to some embodiments.

Turning now to FIG. 13B, a block diagram illustrating example shards of a bitmap index is shown. In the illustrated embodiment, illustration 1300B includes two different shards 1306A and 1306B of events bitmap index 1304 shown in FIG. 13A. In some embodiments, computer system 1210 breaks down bitmap indexes into shards prior to compressing this data for storage in b-trees. In the particular example illustrated in FIG. 13B, events bitmap index 1304 is split down the middle to generate two different shards that include portions of the data included in index 1304. In various embodiments, the two resulting shards 1306A and 1306B are stored in two data files 1340A and 1340B. The pages of these data files may store the data of these shards as Roaring containers that are mapped to various nodes of a b-tree as discussed below with reference to FIG. 13C. In some embodiments, shards of bitmap indexes may further be broken down into shard fragments. For example, if events bitmap index 1304 also included rows (e.g., cities) for a "location" field, then shards 1306A and 1306B would each respectively include two fragments: one that includes the rows of type 1320 field and one that includes the rows of the location field. FIG. 13C, described in detail below, includes an example of rows of a location field that might be included in events table 1302.

In the illustrated embodiment, shard 1306A includes all three rows of bitmap index 1304, but only the first two columns of the index. In contrast, shard 1306B includes all three rows of bitmap index 1304, but only the second two columns of the index. Note that computer system 1210 may generate shards 1306 by splitting up events bitmap index 1304 into smaller or larger portions. These example shards may then be ready to be compressed via compression module 1240 for storage in b-trees 1260.

Turning now to FIG. 13C, a block diagram illustrating example storage of a shard of a bitmap index in a b-tree is shown. In the illustrated embodiment, illustration 1300C includes shard 1306A of events bitmap index 1304 and a b-tree 1260. Details for the various parts of a b-tree are discussed in detail below with reference to FIG. 14. As discussed above, shard 1306A may be split up into shard fragments that are compressed for subsequent storage in b-tree 1260. For example, shard fragment 1350A includes the three rows of the type 1320 field, while shard fragment 1350B includes the two rows of the location 1360 field. As shown, computer system 1210 performs a compression 1342 process to compress fragment 1350A for storage in pages that form b-tree 1260. Note that data from a bitmap index 1212 that has been compressed using Roaring compression may be referred to as a roaring bitmap. As illustrated in FIGS. 13B and 13C, a given data file 1340 corresponds to a given shard 1306 while a single shard fragment (e.g., fragment 1350A) corresponds to one or more pages of a b-tree 1308. If a shard 1306 includes multiple fragments 1350, then the corresponding data file 1340 may include multiple b-trees 1260 for those fragments. For example, database file 1340 may include a first b-tree 1260 for shard fragment 1350A and a second b-tree 1260 for shard fragment 1350B.

Figure 14:
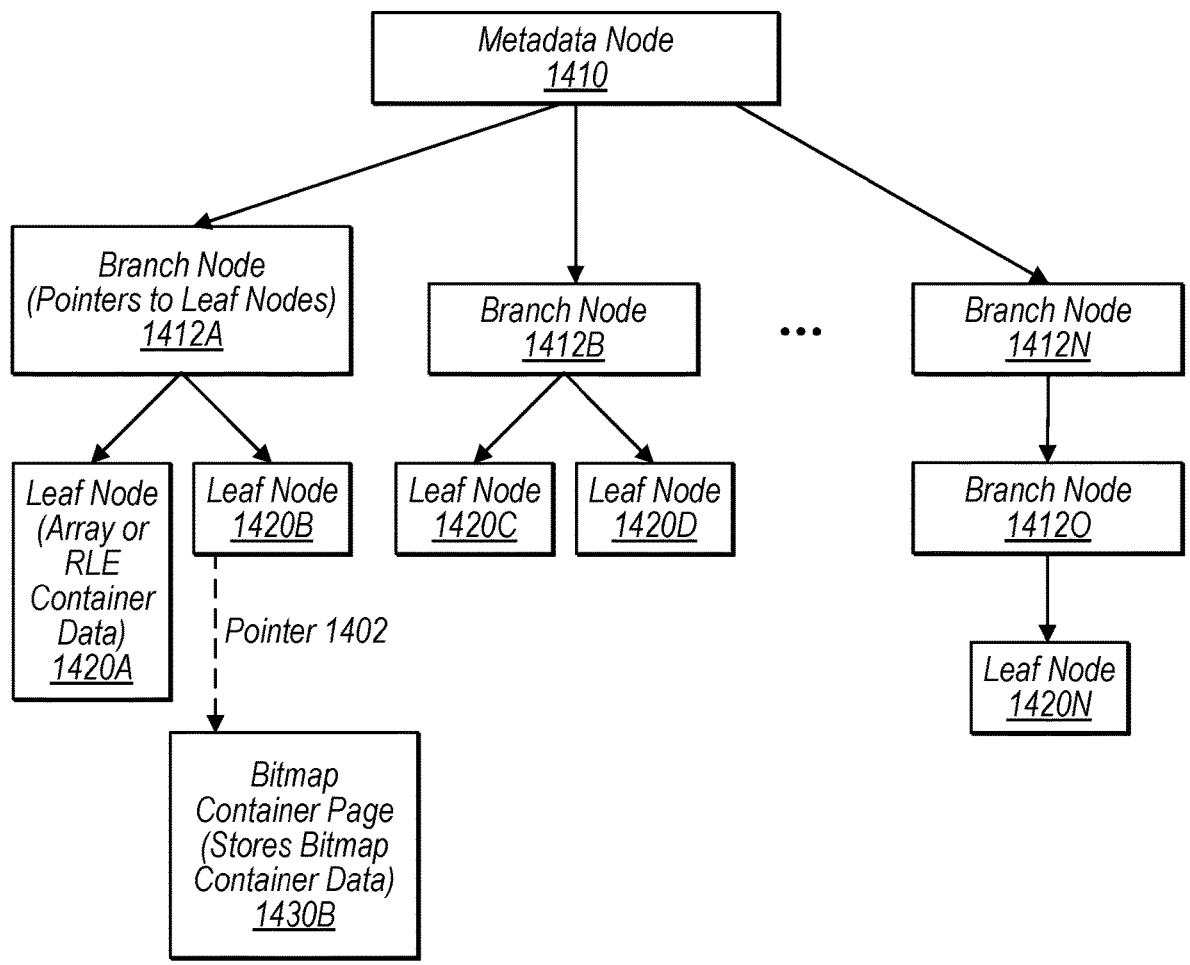
FIG. 14 is a block diagram illustrating example elements of a binary tree, according to some embodiments.

Turning now to FIG. 14, a block diagram illustrating an example b-tree is shown. In the illustrated embodiment, b-tree 1260 comprises various elements, including a metadata node 1410, branch nodes 1412, leaf nodes 1420, and a bitmap container page 1430B. The nodes of b-tree 1260 may correspond to one or more pages of a data file 1340. Consequently, each node of b-tree 1260 may correspond to different types of pages specifying different information. For example, metadata node 1410 may correspond to a metadata page having header information, while a leaf node 1420A may correspond to a data container page (e.g., a data container with run-length encoded data).

Metadata node 1410, in various embodiments, corresponds to a page having header information for b-tree 1260. This header information may serve as a small index that specifies page numbers, parent page numbers, a number of containers, etc. for the nodes of b-tree 1260. Metadata node 1410 may also indicate a number of pages that are stored and thus the number of nodes of b-tree 1260 (if each node of b-tree 1260 corresponds to a single page of a data file 1340). Branch nodes 1412, in various embodiments, correspond to pages that include pointers to lower branch nodes 1412 or leaf nodes 1420—that is, the pages of branch nodes 1412 may include page numbers of pages of lower branch nodes 1412 or leaf nodes 1420 depending on the structure of b-tree 1260. As one particular example, branch node 1412A points to leaf node 1420B, while branch node 1412N points to branch node 1412O (which in turn points to leaf node 1420N).

Leaf nodes 1420, in various embodiments, correspond to pages that store containers having data that has been compressed using Roaring compression techniques. These containers may be one or more of the following types of data containers: array, run-length encoded, or unencoded. The array and run-length encoded containers include compressed bitmap data. In various embodiments, array containers store bitmap data that has been compressed into an array of suffix values that correspond to bit positions of a bitmap index that have been set (are set to "1"). Array containers may be accessible via a prefix value that is common to those suffix values—that is, the prefix value may be used to traverse b-tree 1260 in order to arrive at that the container that stores the corresponding suffix values. In some cases, roaring compression uses 64-bit values to store data. For example, Roaring compression might derive many 64-bit values from the data of a shard, where the first 48 bits of each 64-bit value serve as a lookup key, while the remaining 16 bits are a value. These 64-bit values may identify positions within a shard that have a bit value of "1." As one specific example, if computer system 1210 is attempting to lookup whether the $8^{th}$ bit in a series of $2^{64}$ bits is set, this system uses "000 . . . 000" (48 zeros) as a lookup key to locate a particular container. Once it has located a container, the system can determine whether the container indicates the value "8." If it does, then the $8^{th}$ bit in the series of bits that make up the shard is set.

Run-length encoded containers, in various embodiments, store data for a shard that has been compressed, at least partially, using run-length encoding (RLE). This type of encoding identifies runs of the same data values. That is, a run of data is a sequence in which the same data value occurs in multiple consecutive data elements. In RLE, these runs may be stored as two data values (the start and end of the run), rather than as a run. For example, if the first seven bits of a shard are high bits, then this portion can be represented by the values 0 (for 0th position) and 6 (for the $6^{th}$ position), which identifies the position and length of that run. Finally, an unencoded bitmap container simply stores the bits of a shard fragment without encoding them. In some embodiments, computer system 1210 determines which type of container to use for storing bitmap data based on the number of high bits (or low bits) included in the bitmap data. For example, if the number of high bits for a portion of a shard is less than some threshold, then computer system 1210 selects an array container for that portion.

In some embodiments, unencoded bitmap containers are stored in their own pages that are separate from the leaf node pages due to their size being greater than an allowable size for leaf nodes pages. That is, due to the size of unencoded bitmap container pages being 8 KBs in some embodiments, these pages (in addition to their header information) do not fit in leaf node pages can hold only 8 KBs of data. Consequently, the header information for bitmap container page 1430B may be stored in the page of leaf node 1420B in addition to pointer 1402, which points to the location (e.g., a page number) where bitmap container page 1430B is stored. As one particular example, leaf node 1420A stores a data container with run-length encoded data while leaf node 1420B stores a pointer 1402 to bitmap container page 1430B. Unencoded bitmap containers may also be stored in their own pages to reduce fragmentation when there are non-bitmap containers interspersed between bitmap containers.

In various embodiments, computer system 1210 maintains a root record page, for each data file 1340, that includes a list of b-trees used by computer system 1210. For example, if a given shard of a bitmap index includes three different fragments, then a root record page lists three different b-trees that store a compressed version of the bitmap data included in the given shard. In some embodiments, a root record page is rewritten when a b-tree is added or removed and can be cached within heap memory. A root record page, however, may be append-only in some cases.

As mentioned, b-tree 1260 may be stored as a collection of pages in a file in a database (e.g., on a hard drive of computer system 1210). When changes are made to the pages of this file, these changes are written as new pages to a write-ahead log which may be referred to as a WAL file. Changes may be written to the WAL file in increments of 8 KB pages until the file reaches 10 megabytes (MB), for example. Once this threshold size is met, these changes are written to the database, such that b-tree 1260's corresponding file incorporates the updates. This method of handling updates provides a transaction view at any given point in time of which pages in the WAL file replace pages in the database file. Note that the metadata node 1410 that stores a metadata page includes a write-ahead log ID which specifies a position in the write-ahead log that changes to the b-tree 1260 are checkpointed up to. When writing an update to the b-tree, the disclosed system checks the metadata page to determine a location to start making changes as well as where to begin checkpointing data back into the data file from the write-ahead log. In some embodiments, the disclosed techniques allow for a single leaf of a b-tree 1260 to be rewritten (e.g., one or more containers may be changed) without having to rewrite the entire corresponding data file 1340.

To navigate b-tree 1260 in order to retrieve data using a lookup key (or key range), computer system 1210 may begin at metadata node 1410 and determine which branch node 1412 to take based on the lookup key and the page number, parent page number(s), container number, or other information stored in the metadata node page. Once it has determined which branch to take, computer system 1210 may traverse down that branch and continue traversing down branches of b-tree 1260 until it reaches the node that correspond to the lookup key. As one specific example, a user device may request access to data included in a page of a data file 1340 mapped to leaf node 1420C. In this example, computer system 1210 would traverse down from metadata node 1410 through branch node 1412A to reach leaf node 1420C whose page stores a container having the requested data.

Example Methods

Figure 15:
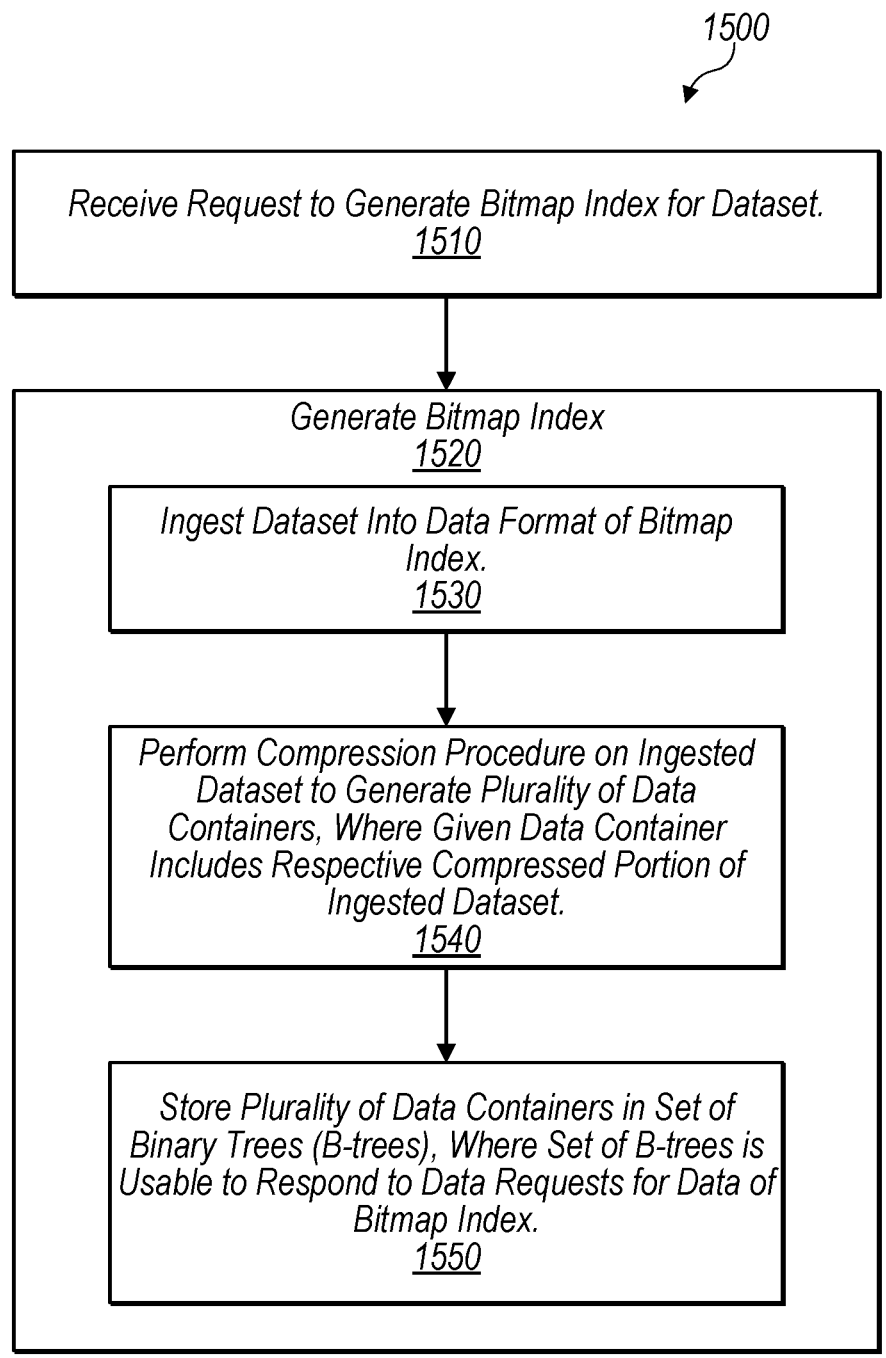
FIG. 15 is a flow diagram illustrating an example method for storing bitmap index data using a set of binary trees, according to some embodiments.

Turning now to FIG. 15, an example method is shown for storing bitmap indexes (e.g., a bitmap index 1212) in a set of b-trees (e.g., b-trees 1260), according to some embodiments. In some cases, method 1500 may be performed by executing a set of program instructions stored on a non-transitory computer-readable medium. In some embodiments, method 1500 includes more or less elements than shown. In some embodiments, the elements of method 1500 may be performed in a different order than shown. For example, method 1500 may include an element in which the VDSM processes a request for data included in the bitmap index generated at element 1520.

At element 1510, in the illustrated embodiment, a computer system (e.g., computer system 1210) receives a request (e.g., storage request 1202) to generate a bitmap index for a dataset. In some embodiments, the request is received by a virtual data source manager (VDSM) executing on the computer system, where the VDSM is operable to manage a virtual data source (VDS) that permits the data requests to be executed against the bitmap index included in the VDS without accessing a separate origin that stores the dataset.

At 1520, the computer system generates a bitmap index. In some embodiments, the generating includes splitting the ingested dataset (e.g., ingested dataset 1222) into a plurality of shards such that each shard includes a corresponding portion of a row of the bitmap index, where a given one of the plurality of shards map to a corresponding one of the set of b-trees. For example, the columns of a bitmap index may be split up into separate shards.

At 1530, the computer system ingests the dataset into a data format of the bitmap index. In some embodiments, the dataset is a database table. As discussed above with reference to FIG. 13A, a bitmap index represented information from a dataset (e.g., type 1320 column of events table 1302) using set bits.

At 1540, the computer system performs a compression procedure on the ingested dataset to generate a plurality of data containers, where a given data container (e.g., a data container 1242) includes a respective compressed portion of the ingested dataset.

At 1550, the computer system stores the plurality of data containers in a set of b-trees (e.g., stores in pages that form the set of b-trees), where the set of b-trees is usable to respond to data requests for data of the bitmap index. In some embodiments, the computer system receives a request for data stored in the VDS. In some embodiments, the computer system accesses the requested data from the bitmap index, where the accessing includes traversing ones of the set of b-trees to extract one or more of the plurality of data containers corresponding to the requested data. In some embodiments, the computer system returns a response to the data request that includes the requested data retrieved from the VDS.

In some embodiments, ones of the plurality of data containers are stored in leaf nodes of the set of b-trees. In some embodiments, the computer system stores, based on a size of a particular data container being greater than a size of the leaf nodes, a pointer to the particular data container in a corresponding leaf node of a b-tree. In some embodiments, the particular data container is a roaring bitmap container that stores a portion of the ingested dataset in an uncompressed bitmap index format.

In some embodiments, the plurality of data containers are stored in corresponding pages of a file, and wherein a given one of the pages corresponds to a node of a b-tree included in the set of b-trees. In some embodiments, in response to receiving a request to write an update for the bitmap index, the computer system writes a new page having the update to a write-ahead log such that a corresponding page of the file is superseded without rewriting the entirety of the file, where the new page is usable for processing subsequent data requests instead of the corresponding page of the file. In some embodiments, a particular one of the plurality of data containers includes an array of suffix values that correspond to bit positions of the bitmap index that have been set, where the particular data container is accessible via a prefix value common to the suffix values. In some embodiments, the compression procedure is a Roaring compression procedure that generates roaring bitmaps.

Figure 16:
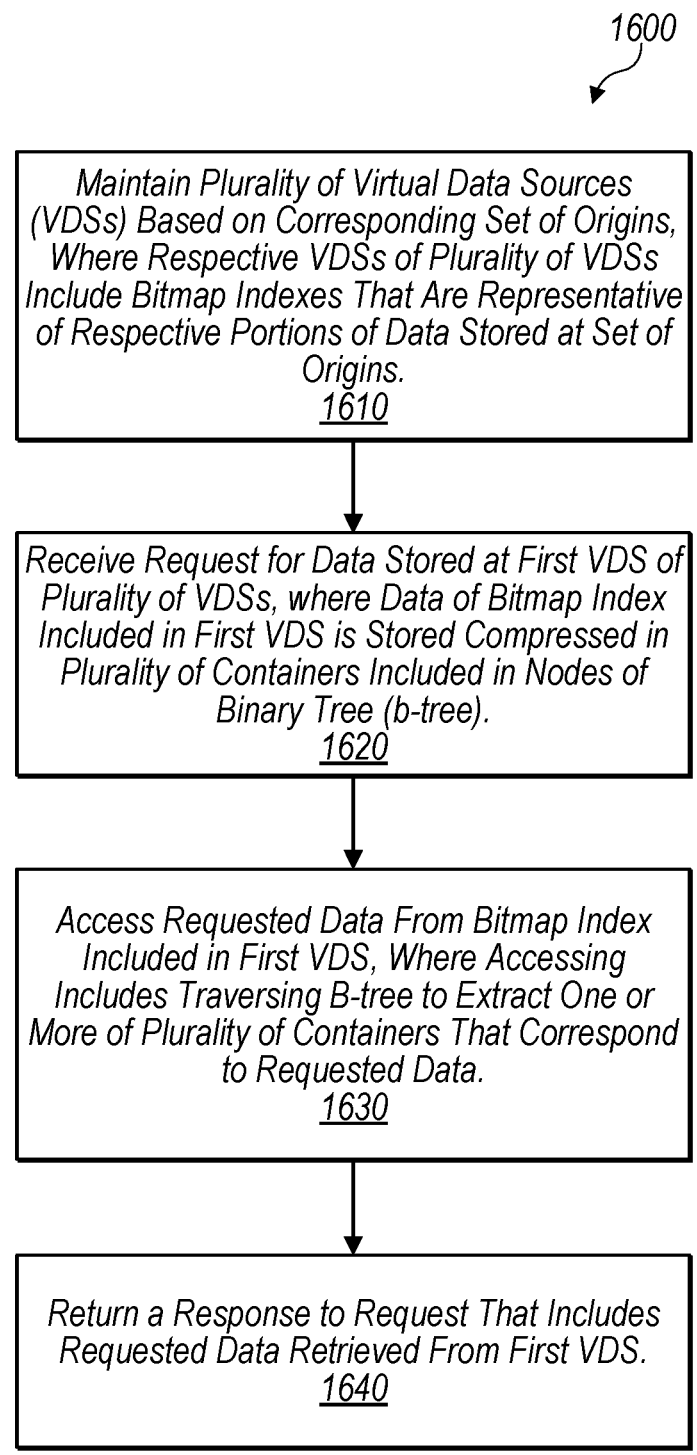
FIG. 16 is a flow diagram illustrating an example method for accessing data stored in VDSs in binary tree format, according to some embodiments.

FIG. 16 is a flow diagram illustrating an example method for accessing data stored in VDSs in binary tree format, according to some embodiments. In some cases, method 1600 may be performed by executing a set of program instructions stored on a non-transitory computer-readable medium. In some embodiments, method 1600 includes more or less elements than shown. In some embodiments, the elements of method 1600 may be performed in a different order than shown.

At element 1610, in the illustrated embodiment, a computer system maintains a plurality of virtual data sources (VDSs) based on a corresponding set of origins, where respective VDSs of the plurality of VDSs include bitmap indexes that are representative of respective portions of data stored at the set of origins.

At 1620, the computer system receives a request for data stored at a first VDS of the plurality of VDSs, where data of a bitmap index included in the first VDS is stored compressed in a plurality of containers included in nodes of a binary tree (b-tree). In some embodiments, a particular one of the plurality of containers includes one or more runs of data values, wherein a given run includes multiples of the same data value stored as a single data value and a count value indicating a total number of the same data value included in the given run.

In some embodiments, the bitmap index stored compressed in the plurality of containers is compressed by identifying a set of numerical values indicative of set bit positions of the bitmap index. In some embodiments, the bitmap index stored compressed in the plurality of containers is compressed by selecting a container type from a plurality of container types based on a size of the set of numerical values and a threshold value. In some embodiments, the bitmap index stored compressed in the plurality of containers is compressed by performing, based on the selected container type, a compression procedure on the set of numerical values to generate one of the plurality of containers. In some embodiments, the plurality of container types includes an array type, a run-length encoded type, and an uncompressed bitmap type.

At 1630, the computer system accesses the requested data from the bitmap index included in the first VDS, where the accessing includes traversing the b-tree to extract one or more of the plurality of containers that correspond to the requested data.

At 1640, the computer system returns a response to the request that includes the requested data received from the first VDS. The data that is returned in response to the request is in its original form. That is, the computer system returns data in a form resembling that stored at an origin rather than data that is in bitmap format.

In some embodiments a compute cluster having a set of compute nodes maintains a plurality of virtual data sources (VDSs) based on a corresponding set of origins, where respective VDSs of the plurality of VDSs include bitmap indexes that are representative of respective portions of data stored at the set of origins, and where data of a bitmap index included in a first VDS of the plurality of VDSs is stored in pages of a file that are mapped to nodes of a set of binary trees (b-trees). In some embodiments, the compute cluster receives a request to update the data of the bitmap index. In some embodiments, the compute cluster writes, based on data that is identified by the request, one or more new pages to a write-ahead log to replace corresponding pages of the file without having to rewrite the file.

In some embodiments, in response to receiving a data request for data of the bitmap index, the compute cluster accessing the one or more new pages specified in the write-ahead log instead of the corresponding pages of the file. In some embodiments, the data of the bitmap index is stored, in first particular ones of the pages of the file, as a plurality of data containers that are generated from a compression procedure, and wherein the first particular pages are mapped to leaf nodes of the set of b-trees. In some embodiments, second particular ones of the pages of the file store data for traversing the set of b-trees to access the plurality of data containers stored in the first particular pages mapped to the leaf nodes. In some embodiments, the compute cluster periodically writes new pages written to the write-ahead log into the file such that the new pages overwrite corresponding older pages of the file.

Exemplary Computer System

Figure 17:
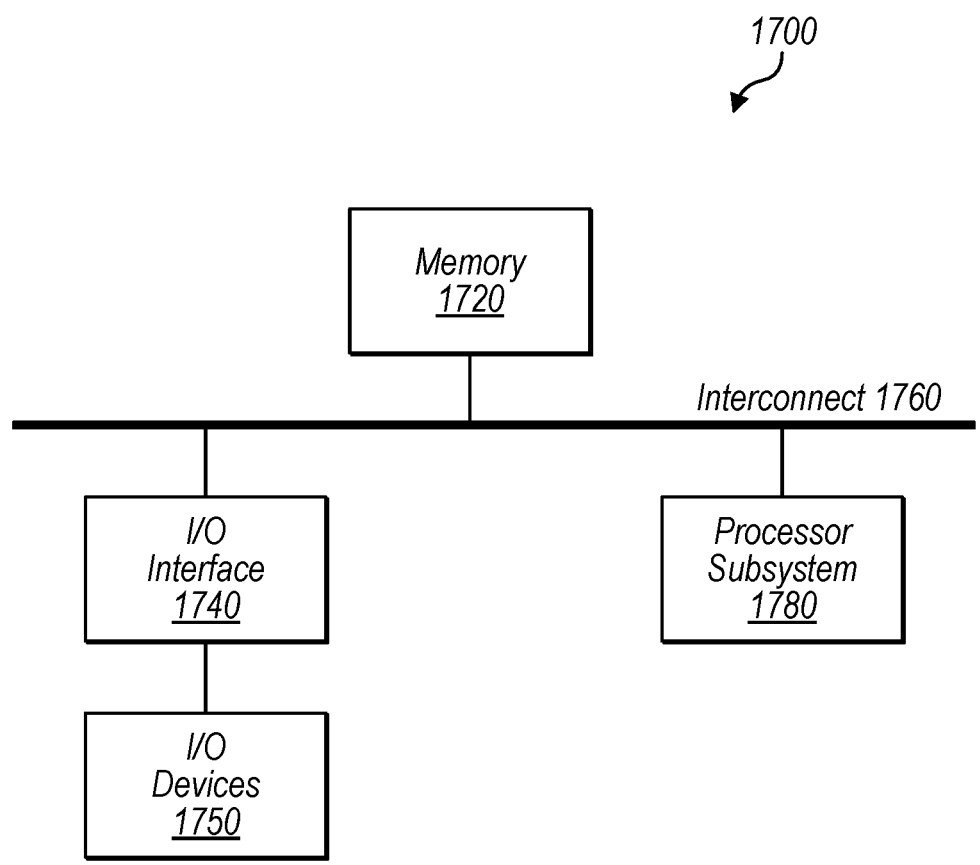
FIG. 17 is a block diagram illustrating an example computer system, according to some embodiments.

Turning now to FIG. 17, a block diagram of an exemplary computer system 1700, which may implement system 100, compute cluster 140, and/or a node 145, is depicted. Computer system 1700 includes a processor subsystem 1780 that is coupled to a system memory 1720 and I/O interfaces(s) 1740 via an interconnect 1760 (e.g., a system bus). I/O interface(s) 1740 is coupled to one or more I/O devices 1750. Computer system 1700 may be any of various types of devices, including, but not limited to, a server system, personal computer system, desktop computer, laptop or notebook computer, mainframe computer system, tablet computer, handheld computer, workstation, network computer, a consumer device such as a mobile phone, music player, or personal data assistant (PDA). Although a single computer system 1700 is shown in FIG. 17 for convenience, system 1700 may also be implemented as two or more computer systems operating together.

Processor subsystem 1780 may include one or more processors or processing units. In various embodiments of computer system 1700, multiple instances of processor subsystem 1780 may be coupled to interconnect 1760. In various embodiments, processor subsystem 1780 (or each processor unit within 1780) may contain a cache or other form of on-board memory.

System memory 1720 is usable store program instructions executable by processor subsystem 1780 to cause system 1700 perform various operations described herein. System memory 1720 may be implemented using different physical memory media, such as hard disk storage, floppy disk storage, removable disk storage, flash memory, random access memory (RAM-SRAM, EDO RAM, SDRAM, DDR SDRAM, RAMBUS RAM, etc.), read only memory (PROM, EEPROM, etc.), and so on. Memory in computer system 1700 is not limited to primary storage such as memory 1720. Rather, computer system 1700 may also include other forms of storage such as cache memory in processor subsystem 1780 and secondary storage on I/O Devices 1750 (e.g., a hard drive, storage array, etc.). In some embodiments, these other forms of storage may also store program instructions executable by processor subsystem 1780. In some embodiments, program instructions that when executed implement a data source 110, a VDS 120, and VDSM 130 may be included/stored within system memory 1720.

I/O interfaces 1740 may be any of various types of interfaces configured to couple to and communicate with other devices, according to various embodiments. In one embodiment, I/O interface 1740 is a bridge chip (e.g., Southbridge) from a front-side to one or more back-side buses. I/O interfaces 1740 may be coupled to one or more I/O devices 1750 via one or more corresponding buses or other interfaces. Examples of I/O devices 1750 include storage devices (hard drive, optical drive, removable flash drive, storage array, SAN, or their associated controller), network interface devices (e.g., to a local or wide-area network), or other devices (e.g., graphics, user interface devices, etc.). In one embodiment, computer system 1700 is coupled to a network via a network interface device 1750 (e.g., configured to communicate over WiFi, Bluetooth, Ethernet, etc.).

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. A method, comprising:
   receiving, by a computer system, a request to generate a bitmap index based on a dataset stored at an origin data source; and
   generating, by the computer system, the bitmap index, wherein the generating includes:
      selecting an ingestion routine based on the origin data source;
      ingesting, using the ingestion routine, at least a portion of the dataset into a data format of the bitmap index;
      performing a compression procedure on the ingested dataset to generate a plurality of data containers, wherein a given data container includes a respective compressed portion of the ingested dataset; and
      storing the plurality of data containers of the bitmap index in pages that are nodes that form a set of binary trees (b-trees); and
   processing a data request for data of the dataset against the set of b-trees without accessing the origin data source.

2. The method of claim 1, wherein the request is received by a virtual data source manager (VDSM) executing on the computer system, and wherein the VDSM is operable to manage a virtual data source (VDS) that permits the data request to be executed against the set of b-trees.

3. The method of claim 1, wherein the processing of the data request includes traversing ones of the set of b-trees to extract one or more of the plurality of data containers corresponding to the requested data; and wherein the method further comprises:
   returning, by the computer system, a response to the data request that includes the requested data.

4. The method of claim 1, wherein the generating includes splitting the ingested portion of the dataset into a plurality of shards such that each shard includes a corresponding portion of a row of the bitmap index, and wherein a given one of the plurality of shards maps to a corresponding one of the set of b-trees.

5. The method of claim 1, wherein the pages are leaf nodes of the set of b-trees, and wherein the method further comprises:
   storing, based on a size of a particular data container being greater than a size of the leaf nodes, a pointer to the particular data container in a corresponding leaf node of a b-tree.

6. The method of claim 5, wherein the particular data container is a roaring bitmap container that stores a portion of the ingested dataset in an uncompressed bitmap index format.

7. The method of claim 1, further comprising:
   in response to receiving a request to write an update for the bitmap index, writing, by the computer system, a new page having the update to a write-ahead log such that a corresponding page of a file is superseded without rewriting the entirety of the file, wherein the new page is usable for processing subsequent data requests instead of the corresponding page of the file.

8. The method of claim 1, wherein a particular one of the plurality of data containers includes an array of suffix values that correspond to bit positions of the bitmap index that have been set, and wherein the particular data container is accessible via a prefix value common to the suffix values.

9. The method of claim 1, wherein the compression procedure is a Roaring compression procedure that generates roaring bitmaps.

10. A method, comprising:
   maintaining, by a compute cluster having a set of compute nodes, a virtual data source (VDS) that is based on a origin data source, wherein the VDS includes a bitmap index that stores data ingested from the origin data source via an ingestion routine associated with the origin data source, and wherein the data of the bitmap index is stored in pages of a file that are mapped to nodes of a set of binary trees (b-trees);
   receiving, by the compute cluster, an update request to update the data of the bitmap index; and
   writing, by the compute cluster based on data that is identified by the update request, one or more new pages to a write-ahead log to replace corresponding pages of the file without having to rewrite the file; and
   processing a data request for data against the set of b-trees and the one or more new pages without accessing the origin data source.

11. The method of claim 10, wherein the one or more new pages specified in the write-ahead log are accessed instead of the corresponding pages of the file as part of the processing of the data request.

12. The method of claim 11, wherein the data of the bitmap index is stored, in first particular ones of the pages of the file, as a plurality of data containers that are generated from a compression procedure, and wherein the first particular pages are mapped to leaf nodes of the set of b-trees.

13. The method of claim 12, wherein second particular ones of the pages of the file store data for traversing the set of b-trees to access the plurality of data containers stored in the first particular pages mapped to the leaf nodes.

14. The method of claim 10, further comprising:
   periodically writing new pages written to the write-ahead log into the file such that the new pages overwrite corresponding older pages of the file.

15. A non-transitory computer-readable medium having program instructions stored thereon that are capable of causing a compute cluster having a set of compute nodes to perform operations comprising:

maintaining a virtual data source (VDS) that is based on a origin data source, wherein the VDS includes a bitmap index that stores data ingested from the origin data source via an ingestion routine associated with the origin data source;

receiving a data request for particular data stored in the bitmap index, wherein the data of the bitmap index is stored compressed in a plurality of containers included in pages that are nodes of a binary-tree (b-tree);

accessing the requested particular data from the bitmap index without accessing the origin data source, wherein the accessing includes traversing the b-tree to extract one or more of the plurality of containers that correspond to the requested particular data; and returning a response to the data request that includes the requested particular data.

16. The non-transitory computer-readable medium of claim 15, wherein a particular one of the plurality of containers specifies a set of ranges corresponding to a set of runs in a bitmap index, wherein a given run includes a series of bits having the same value.

17. The non-transitory computer-readable medium of claim 15, wherein the bitmap index stored compressed in the plurality of containers is compressed by:

identifying a set of numerical values indicative of set bit positions of the bitmap index;

selecting a container type from a plurality of container types based on a size of the set of numerical values and a threshold value; and performing, based on the selected container type, a compression procedure on the set of numerical values to generate one of the plurality of containers.

18. The non-transitory computer-readable medium of claim 17, wherein the plurality of container types includes an array type, a run-length encoded type, and an uncompressed bitmap type.

19. The non-transitory computer-readable medium of claim 15, wherein the plurality of containers are stored in pages of a file, and wherein the operations further comprise:

in response to receiving an update request to write an update for the bitmap index, writing a new page having the update to a write-ahead log such that a corresponding page of the file is superseded without rewriting the entirety of the file, wherein the new page is accessed for future data requests for data instead of the corresponding page of the file.

* * * * *